(12) United States Patent
Barth et al.

(10) Patent No.: US 8,759,207 B2
(45) Date of Patent: Jun. 24, 2014

(54) SEMICONDUCTOR STRUCTURE AND METHOD FOR MAKING SAME

(71) Applicant: Infineon Technologies AG, Neubiberg (DE)

(72) Inventors: Hans-Joachim Barth, Munich (DE); Mathias Vaupel, Regensburg (DE); Rainer Steiner, Regensburg (DE); Werner Robl, Regensburg (DE); Jens Pohl, Bernhardswald (DE); Joem Plagmann, Munich (DE); Gottfried Beer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/671,583

(22) Filed: Nov. 8, 2012

(65) Prior Publication Data

US 2013/0309864 A1    Nov. 21, 2013

Related U.S. Application Data

(62) Division of application No. 12/893,009, filed on Sep. 29, 2010, now Pat. No. 8,330,274.

(51) Int. Cl.
*H01L 21/20* (2006.01)

(52) U.S. Cl.
USPC ........... 438/584; 438/598; 438/618; 438/633; 438/638

(58) Field of Classification Search
CPC ................. H01L 21/76807; H01L 2221/1021; H01L 2221/1031; H01L 2221/1036; H01L 2224/05006; H01L 2224/05546
See application file for complete search history.

(56) References Cited

U.S. PATENT DOCUMENTS

| 2002/0187640 A1* | 12/2002 | Wake ........................... 438/691 |
| 2003/0194850 A1* | 10/2003 | Lewis et al. ................... 438/584 |
| 2005/0085070 A1 | 4/2005 | Park |

* cited by examiner

*Primary Examiner* — Kyoung Lee
(74) *Attorney, Agent, or Firm* — Infineon Technologies AG; Philip Schlazer

(57) ABSTRACT

One or more embodiments relate to a method of forming a semiconductor structure, comprising: providing a workpiece; forming a barrier layer over the workpiece; forming a seed layer over the barrier layer; forming an inhibitor layer over the seed layer; removing a portion of said inhibitor layer to expose a portion of the seed layer; and selectively depositing a fill layer on the exposed seed layer.

35 Claims, 16 Drawing Sheets

SEMICONDUCTOR STRUCTURE AND METHOD FOR MAKING SAME

RELATED APPLICATION INFORMATION

This application is a divisional application of U.S. patent application Ser. No. 12/893,009. filed on Sep. 29, 2010. Patent application Ser. No. 12/893,009 in hereby incorporated by reference herein.

FIELD OF THE INVENTION

One or more embodiments relate to relate to semiconductor structures and methods for making semiconductor structures.

BACKGROUND OF THE INVENTION

Single damascene or dual-damascene electroplating of large structures (which may, for example, include metal lines, vias, bond pads, redistribution layers on top of passivation or in fan-in and fan-out wafer level ball grid array concepts) may suffer from a thick overburden of the plated metal on planar surfaces outside of the damascene feature. This heavy metal overburden may lead to long plating times and especially to extremely long chemical mechanical polishing (CMP) or etching times to remove and planarize the metal overburden on the planar surfaces. These long CMP or etching times may make the process very expensive and unfavorable for volume manufacturing.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become clear better understood by reference to the following detailed description. The elements of the drawings are not necessarily to scale relative to each other.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
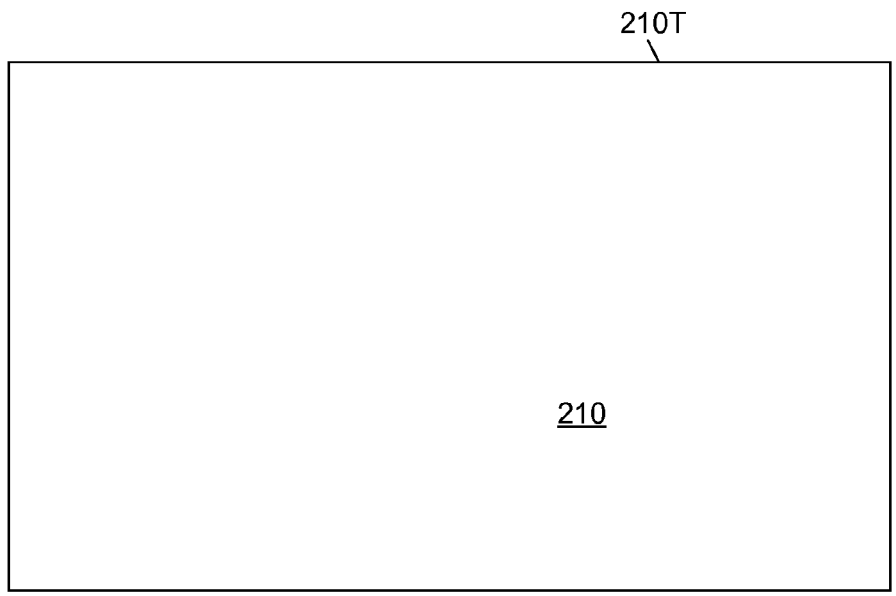
FIGS. 1 through 8 show a method for making a structure in accordance with an embodiment of the present invention.

FIG. 1 shows a workpiece 210. In one or more embodiments, the workpiece 210 may be part of a semiconductor structure or it may incorporate a semiconductor structure. The semiconductor structure may be a semiconductor chip and/or an integrated circuit and/or a semiconductor device. In one or more embodiments, the workpiece may be part of an electronic device. The electronic device may be a semiconductor device. The workpiece may include a semiconductor substrate with devices and a multilevel interconnect architecture overlying the semiconductor substrate. The semiconductor substrate may comprise bulk silicon, a bulk silicon wafer, silicon on insulator (SOI), a silicon on insulator wafer, silicon carbide (SiC), silicon carbide wafers, germanium (Ge), germanium wafers, gallium arsenide (GaAS), a gallium arsenide wafer or other III/V materials and III/V wafers.

The workpiece 210 may comprise an embedded wafer level ball grid array (eWLB) artificial wafer or panel. The workpiece 210 may comprise a silicon interposer or silicon substrate or alternatively an organic substrate or glass substrate. The workpiece may comprise a printed circuit board (PCB) or laminate panel. The workpiece 210 may comprise a photo-voltaic panel. The workpiece 210 may consist essentially of a single homogeneous layer or may comprise a plurality of layers of different materials. In one or more embodiments, the workpiece 210 may, for example, be a dielectric layer.

The workpiece 210 includes a top surface 210T. The top surface 210T may comprise a dielectric material, a semiconductive material, a conductive material or a mixture of different materials.

Figure 2:
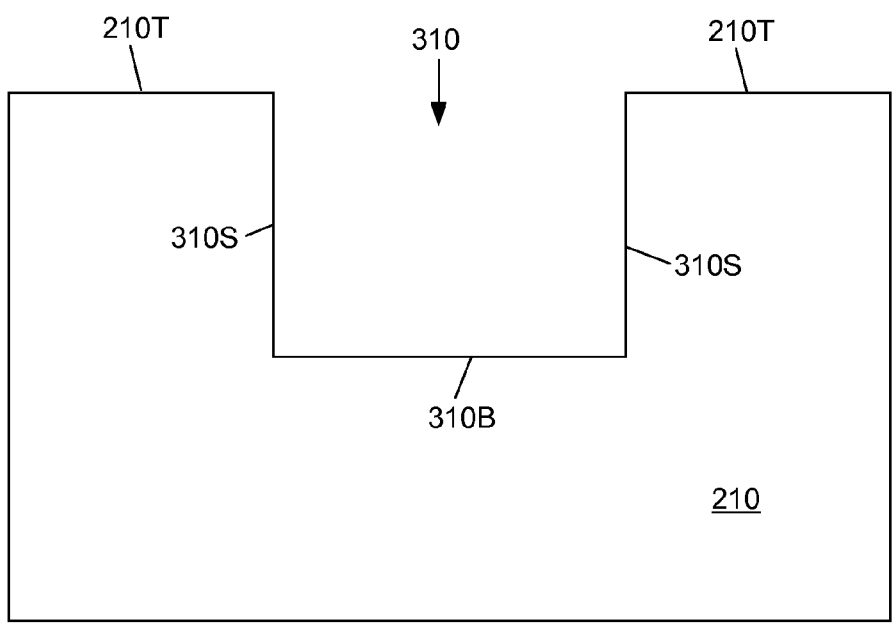

Referring to FIG. 2, an opening 310 may be formed in the workpiece 210 so as to form a workpiece 210 including an opening 310. Generally, the opening 310 may be any type of opening. The opening 310 may be a trench or a hole. The opening may have any lateral cross-sectional shape. The opening 310 may be formed in any way. For example, the opening 310 may be formed using an etching process such as a dry etching process.

Still referring to FIG. 2, the opening 310 may include a bottom surface 310B as well as one or more sidewall surfaces 310S. In one or more embodiments, the one or more sidewall surfaces 310S may be substantially vertical. However, in other embodiments, the sidewalls 310S may have some other shape such as sloped, curved or step-shaped. The opening 310 may, for example, be formed using an etching process such as a dry etching process. The opening 310 may be formed by one, two or more masking steps. In some embodiments, the opening 310 may be a single damascene opening. However, in some embodiments, the opening 310 may be replaced with a multi-damascene opening such as a dual-damascene opening. In some embodiments, the opening 310 may be formed using one or more masking steps. In some embodiments, the opening 310 may be formed using two or more masking steps.

In the embodiment shown in FIG. 2, the opening 310 may be formed in the workpiece 310 so that it may not go through the workpiece. In one or more embodiments, the opening 310 may be formed in the workpiece 210 so as to go through the workpiece (e.g. from a top surface to a bottom surface).

In one or more embodiments, the workpiece 210 may be substantially homogeneous. In one or more embodiments, the workpiece 210 may comprise two or more layers which include different materials.

In one or more embodiments, the opening 310 may have a width of about 1 μm (micron) or greater. In one or more embodiments, the opening 310 may have a width of about 1.5 μm (microns) or greater. In one or more embodiments, the opening 310 may have a width of about 2 μm (microns) or greater.

In one or more embodiments, the opening 310 may have a minimum width of about 1 μm (micron) or greater. In one or more embodiments, the opening 310 may have a minimum width of about 1.5 μm (microns) or greater. In one or more embodiments, the opening 310 may have a minimum width of about 2 μm (microns) or greater.

Figure 3:
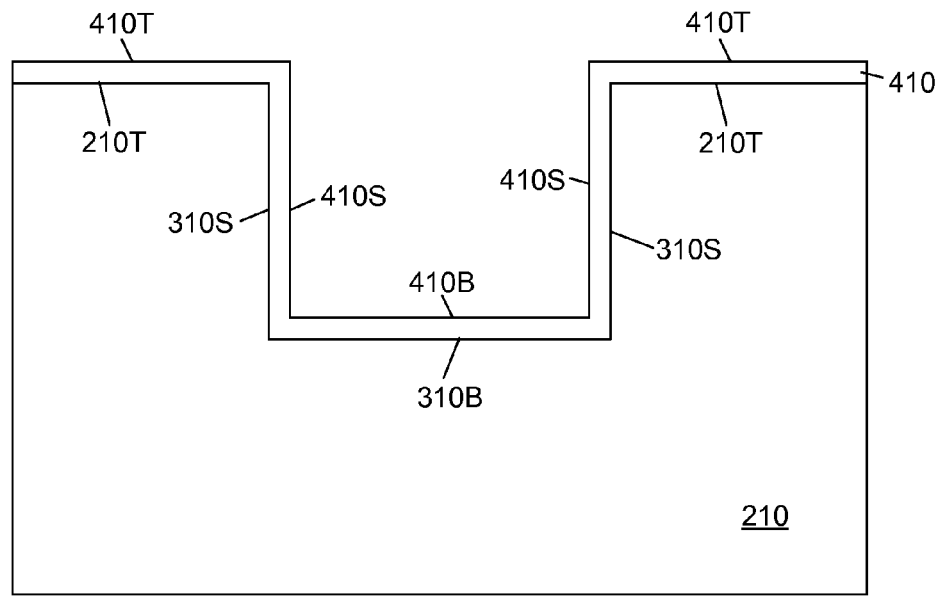

Referring to FIG. 3, a barrier layer 410 may be formed over the workpiece 210 such that the barrier layer 410 may be formed over the top surface 410T and within the opening 310. Hence, the barrier layer 410 may be formed over the top surface 210T of the workpiece 210 as well as over the sidewall surfaces 310S and bottom surface 310B of the opening 310. In one or more embodiments, the barrier layer 410 may be formed directly on the workpiece 210. The barrier layer 410 may be formed by a deposition process and/or a growth process. The deposition process may be a substantially conformal deposition. However, a non-conformal but continuous deposition may also be feasible. The barrier layer 410 may, for example, be deposited by a chemical vapor deposition (CVD) process, a physical vapor deposition (PVD) process and/or a sputtering process. Referring to FIG. 3, the barrier layer 410 may include a top surface 410T, one or more sidewall surfaces 410S and a bottom surface 410B. In one or more embodiments, the barrier layer 410 may itself include a stack of two or more sub-layers which include different materials.

Figure 4:
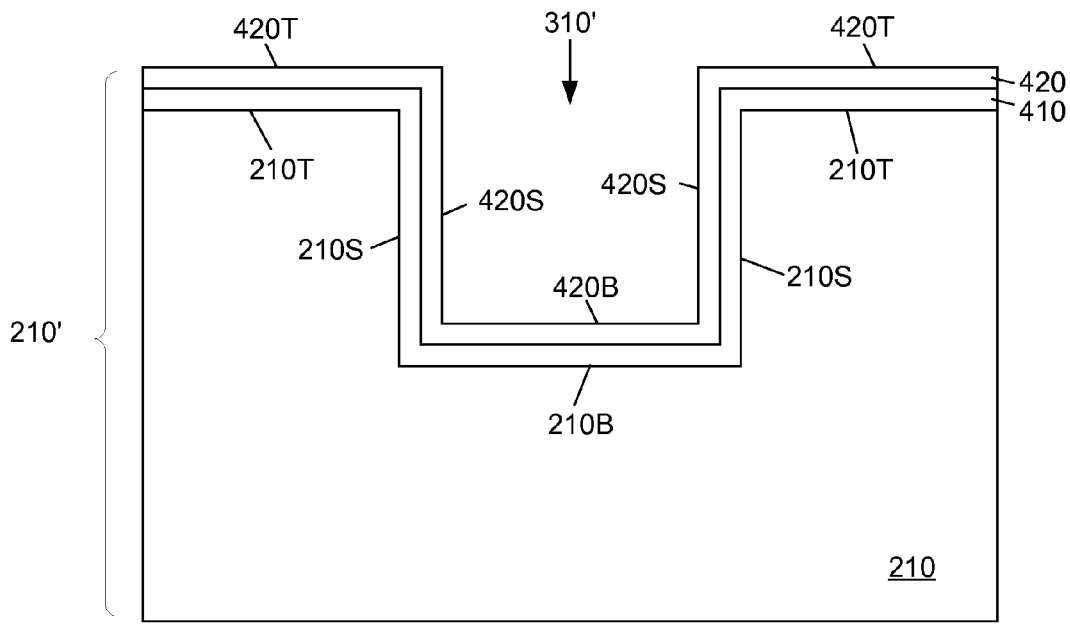

Referring to FIG. 4, a seed layer 420 may then be formed over the barrier layer 410. The seed layer 420 may be formed over the top surface 410T, the sidewall surfaces 410S and the bottom surface 410B of the barrier layer 410. The seed layer 420 may be formed within the opening 310 as well as outside the opening 310. With reference to the workpiece 210 and opening 310, the seed layer 420 may be formed over the top surface 210T of the workpiece 210 as well as over the sidewall surfaces 210S and bottom surface 210B of the opening 310. The seed layer 420 may be formed by a deposition process and/or a growth process. The deposition process may be a substantially conformal deposition. However, a non-conformal but continuous deposition may also be feasible. The seed layer 420 may be deposited by a chemical vapor deposition process, a physical vapor deposition process and/or a sputtering process. The seed layer 420 may include a top surface 420T, one or more sidewall surfaces 420S and a bottom surface 420B as shown in FIG. 4.

Referring to FIG. 4, after the formation of the seed layer 420, a structure 210' may be formed having an opening 310'. The structure 210' may itself be viewed as a workpiece 210' upon which additional layers may be formed. The workpiece 210' may be viewed as having an opening 310'. The top surface 420T of the seed layer 420 corresponds to the top surface of the workpiece 210'. Likewise, the sidewall surfaces 420S and bottom surface 420B of the seed layer 420 corresponds to the sidewall surfaces and bottom surface, respectively, of the opening 310'.

Figure 5:
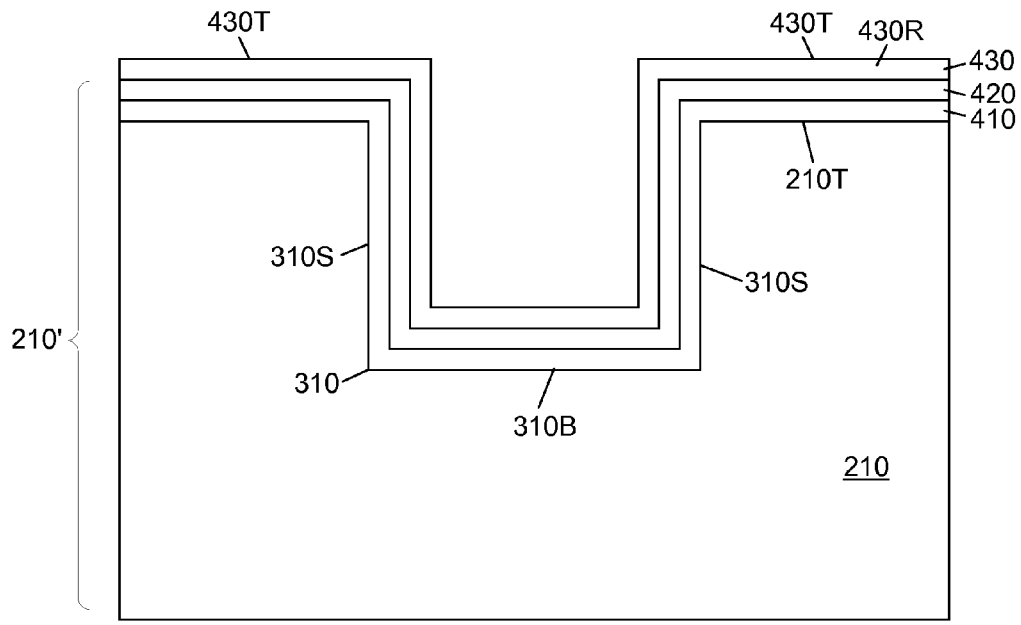

Referring to FIG. 5, an inhibitor layer 430 may then be formed over the seed layer 420. The inhibitor layer 430 may be formed over the top surface 420T, the sidewall surfaces 420S and the bottom surface 420B of the seed layer 420. With reference to workpiece 210 and opening 310, the inhibitor layer 430 may be formed over the top surface 420T of workpiece 210 as well as over the sidewall surfaces 420S and bottom surface 420B of the opening 310. The inhibitor layer 430 may be formed within the opening 310 as well as outside the opening 310.

With reference to workpiece 210' and opening 310', the inhibitor layer 430 may be formed over the top surface of workpiece 210' as well as over the bottom and sidewall surfaces of opening 310'.

The inhibitor layer 430 may be formed by a deposition process and/or a growth process. The deposition process may be a substantially conformal deposition process. However, a non-conformal but continuous deposition may also be feasible. The inhibitor layer 430 may be formed by a chemical vapor deposition, a physical vapor deposition and/or a sputtering process. The inhibitor layer 430 may include a top surface 430T, one or more sidewall surfaces 430S and a bottom surface 430B.

Figure 6:
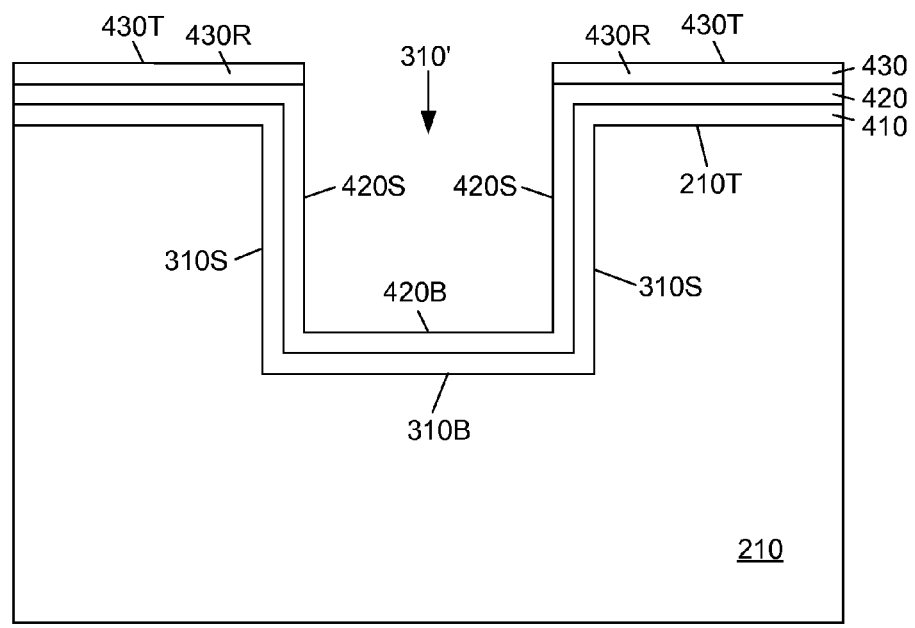

Referring to FIG. 6, the seed layer 430 may be removed from at least a portion of the bottom surface 420B and/or from at least a portion of the sidewall surfaces 420S of the seed layer 430.

Many different embodiments are possible. Referring to FIG. 6, in one or more embodiments, the inhibitor layer 430 may be removed from at least a portion of the bottom surface 420B of the seed layer 420. Hence, in one or more embodiments, the inhibitor layer 430 may be removed from a portion of the bottom surface. In one or more embodiments, the seed layer may be removed from all (or substantially all) of the bottom surface. In one or more embodiments, the inhibitor layer 430 may, for example, be removed from all (or substantially all) of the bottom surface 420B and, additionally, from at least a portion of the sidewall surfaces 420S. In one or more embodiments, the inhibitor layer may be removed from a portion of the sidewall surfaces 420. In one or more embodiments, the inhibitor layer 420 may be removed from all (or substantially all) or the sidewall surfaces 420.

In one or more embodiments, substantially none (or none) of the inhibitor layer 430 may be removed from over the top surface 420T of the seed layer 420.

In one or more embodiments, a remaining portion 430R of the inhibitor layer 430 may be allowed to remain over all (or substantially all) of the top surface 420T of the seed layer 420. In addition, in one or more embodiments, it is possible that some amount of inhibitor layer may be allowed to remain over a portion of the sidewall surfaces 420S (for example, over an upper portion of the sidewall surfaces 420S).

It is understood that it may be desirable to leave the remaining portion 430R on all of the top surface 420T but, due to the limitations of the removal process, it may be necessary to remove a small portion from the sidewall surfaces 420S as well.

It is seen that removal of the inhibitor layer 430 exposes the seed layer in places where the inhibitor layer 430 has been removed.

In one or more embodiments, the removal of a portion of the inhibitor layer 430 may be performed without removing substantially any of the underlying seed layer 420.

Referring again to FIG. 6, from the perspective of opening 310' (defined by the bottom and sidewall surfaces of the barrier layer 420), in some embodiments, the inhibitor layer 430 may be removed from at least a portion of the interior of the opening 310'. Hence, the inhibitor layer 420 may be removed from at least a portion of the surfaces that define the opening 310'. As noted above, these surfaces include the bottom surface 420B and one or more sidewall surfaces 420S of the seed layer 420. In some embodiments, the inhibitor layer 430 may be removed from substantially all of the interior of the opening 310' (e.g. from substantially all of the surfaces that define the opening 310').

In some embodiments, the inhibitor layer 430 may be removed from the bottom surface 420S of the opening 310' as well as from at least a portion of the sidewall surfaces 420S. In some embodiments, the inhibitor layer 430 may be removed from the bottom surface 420S as well as substantially all of the sidewall surfaces 420S. In one or more embodiments, the inhibitor layer 430 may be removed (for example, selective removed) from inside the opening 310' but left remaining outside the opening 310'.

In some embodiments, removal of the inhibitor layer 430 may thus expose at least portion of the seed layer 420 within the opening 310'. For example, the bottom surface 420B and at least a portion of the sidewall surfaces 420S of the seed layer 420 may be exposed. In some embodiments, the removal of the inhibitor layer 430 may expose the bottom surface 420B and substantially all of the sidewall surfaces 420S of the seed layer 420.

With reference to opening 310 (as shown in FIG. 2), in some embodiments, at least a portion of the inhibitor layer 430 that lies within the opening 310 may be removed. The removal leaves a remaining portion of the inhibitor. At least a part of this remaining portion may lie outside the opening 310 and may overlie a top surface of the workpiece 210T. It is understood that a part of the remaining portion of the inhibitor layer (e.g. that has not been removed) may still lie within the opening 310.

The inhibitor layer 430 may be removed in different ways. In one or more embodiments, the removal may be achieved using energy to ablate the unwanted portion of the inhibitor layer. In one or more embodiments, the energy used may be a thermal energy. In one or more embodiments, the energy may be an electromagnetic energy. In one or more embodiments, the energy may be an optical energy. The optical energy may be laser energy and the process used may be a laser ablation process. In one or more embodiments, the laser ablation process may be accomplished by a laser direct structuring (LDS). This may, for example, be accomplished by an Excimer laser via mask projection. In one or more embodiments, the laser ablation process may be accomplished by laser direct writing (LDW). This may, for example, be accomplished by a Nd-YAG laser or other solid state lasers. In one or more embodiments, the removal process may be accomplished by a combination of laser direct structuring (LDS) and laser direct writing (LDW).

Other ways, may also be used to remove a portion of the inhibitor layer 430. In one or more embodiments, the removal process may include a chemical process. In one or more embodiments, the removal process may include a mechanical process. In one or more embodiments, the removal process may include an etching process. In one or more embodiments, the etching process may include a dry etching process. In one or more embodiments, the etching process may include a wet etching process.

Figure 7A:
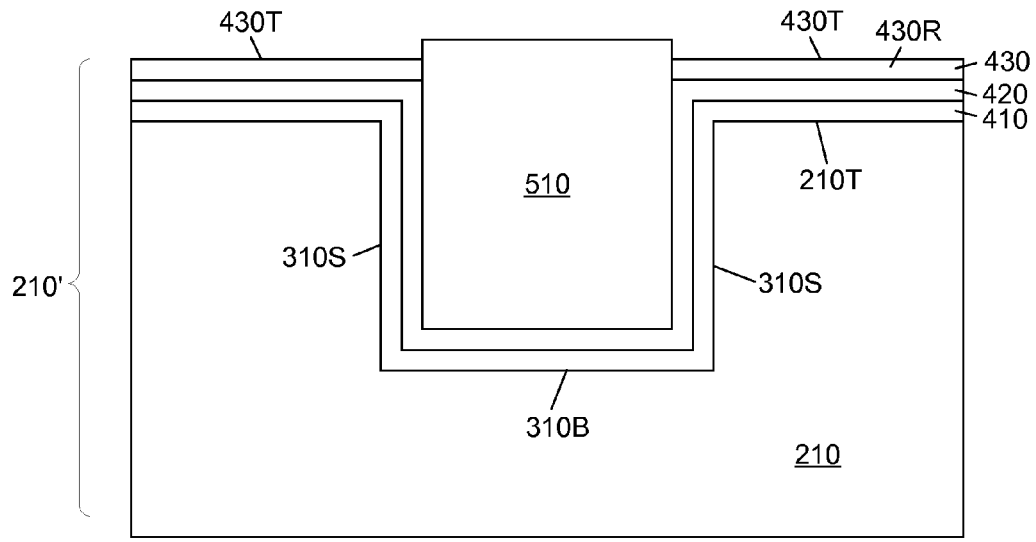

Referring to FIG. 7A, a fill layer 510 may be formed within the opening 310 and may at least partially fill the opening 310. In one or more embodiments, the fill layer 510 may substantially fill the opening 310.

In one or more embodiments, the fill layer 510 may form on the exposed bottom surface 420B and sidewall surfaces 420S of the seed layer 420. In one or more embodiments, substantially none of the fill layer 510 may form on the inhibitor layer. However, it is possible that some part of fill layer material may spill over onto the inhibitor layer. With reference to the workpiece 210' and opening 310' shown in FIG. 6, the fill layer may be formed within the opening 310' and may at least partially fill the opening 310'. In one or more embodiments, the fill layer may substantially fill the opening 310'.

In one or more embodiment, the formation process for forming the fill layer 510 may be a selective formation process. For example, the fill layer 510 may form on the exposed seed layer while substantially none of the fill layer 510 forms on the inhibitor layer. However, as noted, it may be possible that some amount of fill layer still overlies the inhibitor layer because the fill layer (formed on the exposed seed layer) may spill over so as to overlie said inhibitor layer.

In one or more embodiments, the fill layer 510 may be formed by a deposition process and/or a growth process. In one or more embodiments, the deposition process may be a selective deposition process. Examples of deposition processes which may be used include, but not limited to, an electroplating process, an electroless plating process, and a chemical vapor deposition process.

Depending upon the deposition process used, the seed layer may serve functionally as a seed layer (e.g. for an electroplating process) or as an activation layer (e.g. for an electroless plating process) or as a nucleation layer (e.g. for a chemical vapor deposition process).

In one or more embodiments, the fill layer 510 may deposit on the seed layer 420 but substantially none of the fill layer 510 may deposit on the inhibitor layer. In one or more embodiments, the inhibitor layer may include a material which may prevent or discourage or retard the deposition and/or nucleation and/or growth and/or activation on the inhibitor layer. However, the fill layer may laterally spill over onto the top surface of the inhibitor layer. This may occur after the top surface of the fill layer goes higher than the top surface of the inhibitor layer. Hence, some amount of fill layer may still overlie a portion of the inhibitor layer.

In one or more embodiments, the deposition process may include an electroplating process. In one or more embodiments, during the electroplating process the fill layer 510 may electroplate onto the exposed surfaces of the seed layer 420. In one or more embodiments, substantially none of the fill layer 510 may electroplate onto the exposed surfaces of the inhibitor layer 430.

In one or more embodiments, the deposition process may include an electroless plating process or a selective chemical vapour deposition (CVD) process. In one or more embodiments, during the electroless plating or the selective CVD process the fill layer 510 may deposit or grow onto the exposed surfaces of the seed layer 420 but substantially none may deposit and/or nucleate and/or grow on the exposed surfaces of the inhibitor layer 430.

Hence, in one or more embodiments, the inhibitor layer may comprise one or more materials which prevent, inhibit or discourage the forming of the fill layer onto the inhibitor layer.

For example, in one or more embodiments, the inhibitor layer may comprise one or more materials which prevent, inhibit or discourage the electroplating of the fill layer material onto the inhibitor layer during an electroplating process onto the inhibitor layer. In one or more embodiments, the inhibitor layer may include at least one material which may inhibit, discourage or prevent the nucleation of the fill layer material.

Likewise, in one or more embodiments, the inhibitor layer may comprise one or more materials which prevent, inhibit or discourage the deposition of the fill layer material during, for example, electroplating process and/or electroless plating and/or during a CVD (chemical vapor deposition) process.

In one or more embodiments, the inhibitor layer may, for example, comprise tantalum metal and/or a tantalum alloy and/or a tantalum compound (e.g. tantalum nitride). Because of the inhibitor layer 430, the fill layer 510 may form only on the exposed surfaces of the seed layer 420 and not on the exposed surfaces of the inhibitor layer 430.

In one or more embodiments, it may be possible (as shown) that a small amount of the fill layer 510 may rise above the top surface 430T of the inhibitor layer 430.

As noted, it is possible that the fill layer 510 may spill over onto the inhibitor layer 430.

Figure 7B:
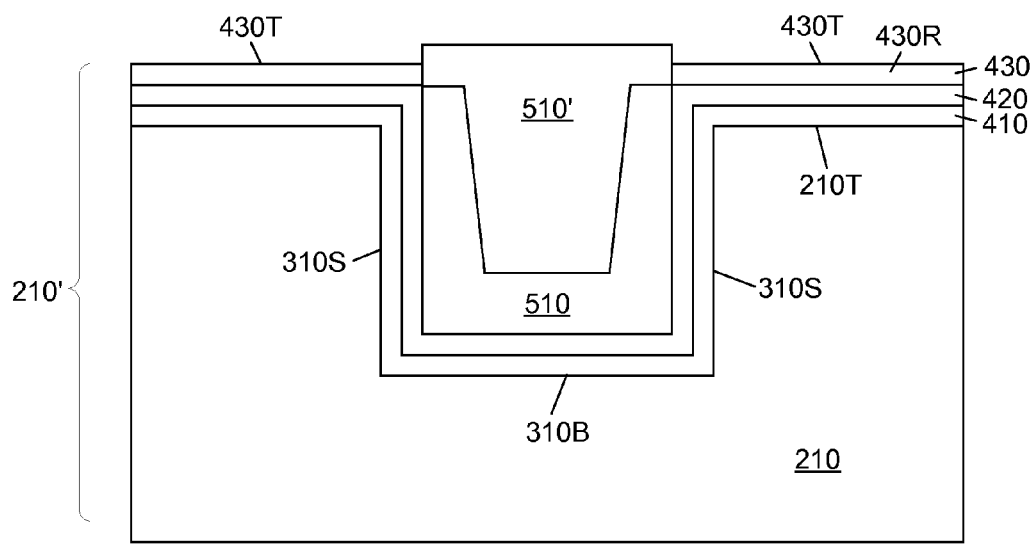

Referring to FIG. 7B, in another embodiment, it is also possible that the fill layer 510 only partially fill the opening 310. This is shown, for example, in FIG. 7B. A second deposition process (which may, for example, be an electroplating process or an electroless process or a CVD process) may be performed to electroplate a second fill layer 510' onto the first fill layer 510.

Referring again to FIG. 7A, the remaining portion 430R of the inhibitor layer 430 as well as portions of the seed layer 420, the barrier layer 410 and the fill layer 510 may then be removed. The removed portions may include portions overlying the top surface 210T of the workpiece 210. The removal may be accomplished by a chemical mechanical polishing process and/or an etching process. For example, the structure shown in FIG. 7A (or FIG. 7B) may be chemically mechanically polished so that barrier layer 410, the seed layer 420 and the fill layer 510 may be made flush with the top surface 210T of the workpiece 210. The structure shown in FIG. 8 shows a conductive feature 610 disposed in the workpiece 210.

In one or more embodiments, the process for making the conductive feature 610 may include a damascene process such as a single damascene process.

Figure 8:
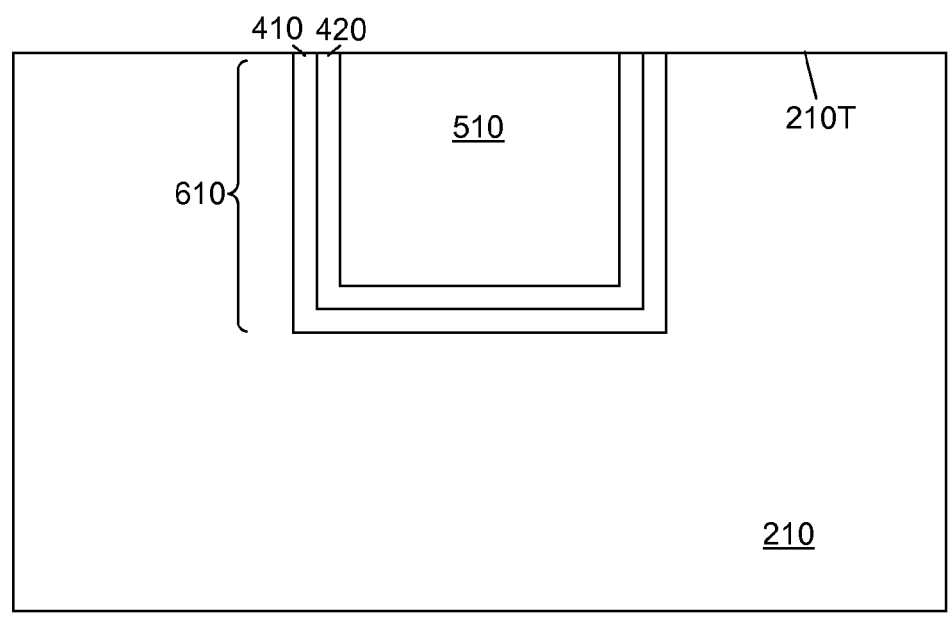

Referring to FIG. 8, in one or more embodiments, the workpiece 210 may, for example, represent a substrate. A substrate may be a semiconductor substrate. In one or more embodiments, a semiconductor substrate may be a bulk-semiconductor substrate such as a bulk-silicon substrate. In one or more embodiments, a semiconductor substrate may be an SOI substrate. An SOI substrate may include a bulk-semiconductor substrate, an insulator layer overlying the bulk-semiconductor substrate and a semiconductor layer overlying the insulator layer.

The conductive feature 610 may represent a conductive via formed within the substrate. A portion of the bottom surface of the substrate 210 may be removed (possibly by etching or by backside grinding) so that a bottom surface of the conductive feature 610 is exposed.

In this case the conductive feature 610 may represent a through-substrate via.

In one or more embodiments, the workpiece 210 may comprise two or more different layers (for example, two or more layers of different materials). As an example, referring to FIG. 9, the workpiece 210 may comprise a dielectric layer 222 overlying a layer 224. In the embodiment shown in FIG. 9, the conductive feature 610 is disposed through the dielectric layer 222 and makes direct contact with a top surface of layer 224.

Figure 9:
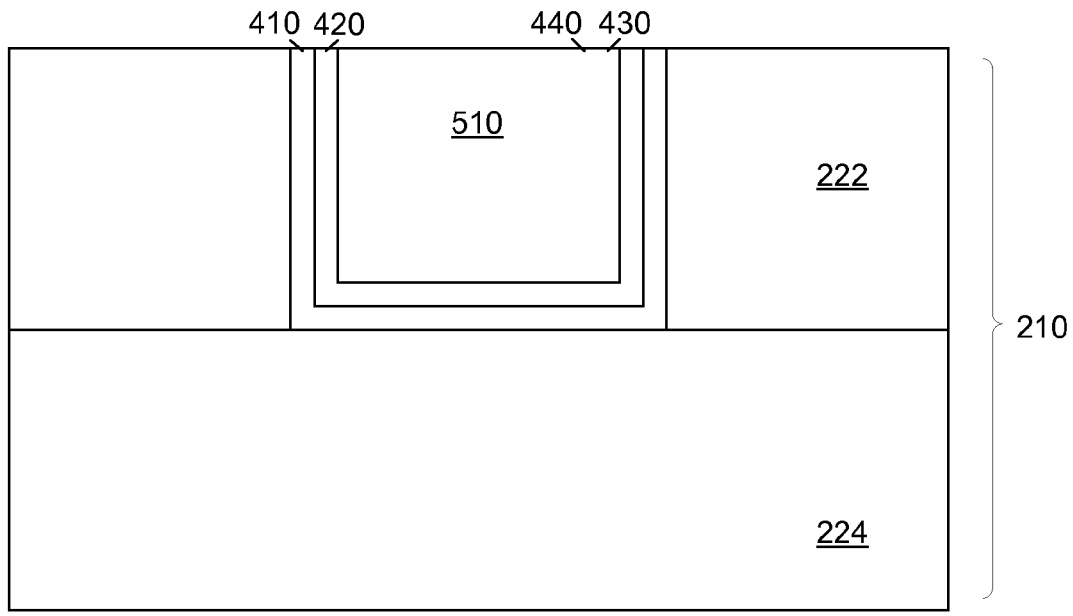
FIG. 9 shows a structure in accordance with an embodiment of the present invention.

Referring to FIG. 9, the layer 224 may represent a substrate. The conductive feature 610 may represent a conductive via that electrically couples a metal line formed in a metallization level (e.g. metal-1) to the substrate 224. A conductive via that electrically couples a metal line of a metallization level to a substrate may also be referred to as a conductive contact. In some embodiments, a conductive via (or conductive contact) may be useful in routing electrical signals primarily in a vertical direction.

A metallization level may include one or more portions. For example, a metallization level may include two or more laterally spaced apart portions. Two or more of the portions may be electrically isolated from each other.

A metallization level may include one or more metal lines. A metallization level may include two or more metal lines. Two or more metal lines of the metallization level may be spaced apart from each other. Two or more metal line may be electrically isolated from each other. In some embodiments, metal lines may be useful for routing electrical signals primarily in a horizontal direction. A metal line may include a pad structure. The pad structure of the metal line may be wider than a remaining portion of the metal line. The pad structure of a metal line may, for example, be referred to as a bond pad, a contact pad and/or a landing pad.

A metallization level may be any metallization level. For example, it may be metal-1, metal-2, metal-3 all the way up to and including the final metallization level.

Figure 10:
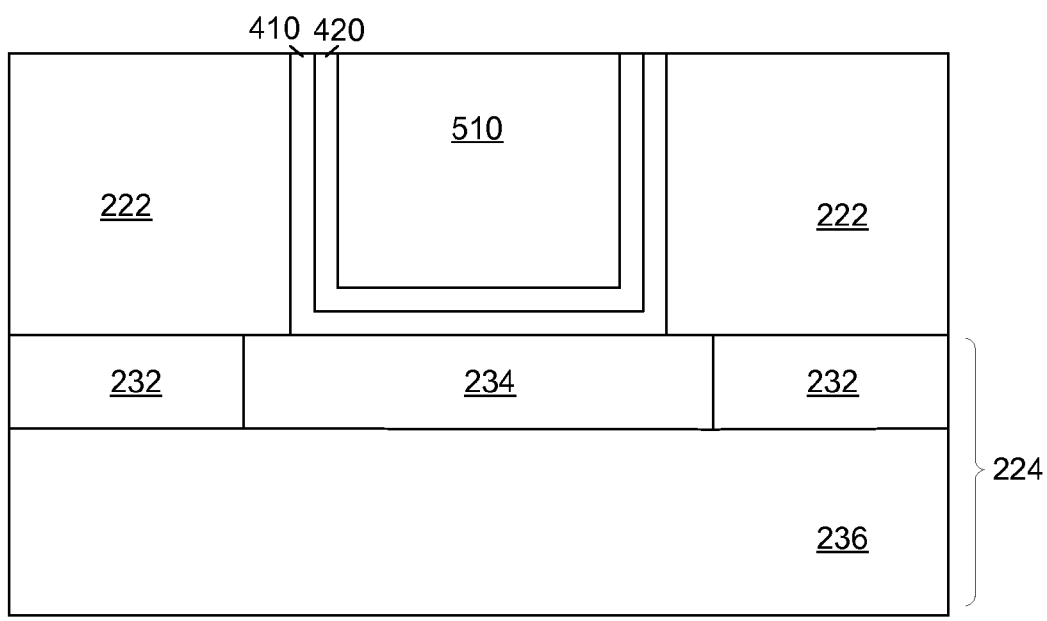
FIG. 10 shows a structure in accordance with an embodiment of the present invention.

Referring to FIG. 10, it is seen that the layer 224 may comprise a dielectric layer 232 overlying a layer 236. The layer 224 may further comprise a conductive layer 234 disposed in the dielectric layer 232. In one or more embodiments, the conductive layer 234 may represent a conductive via while the conductive feature 610 may represent a metal line belonging to the metal-1 metallization level. In this case, the layer 236 may represent a substrate.

Figure 11:
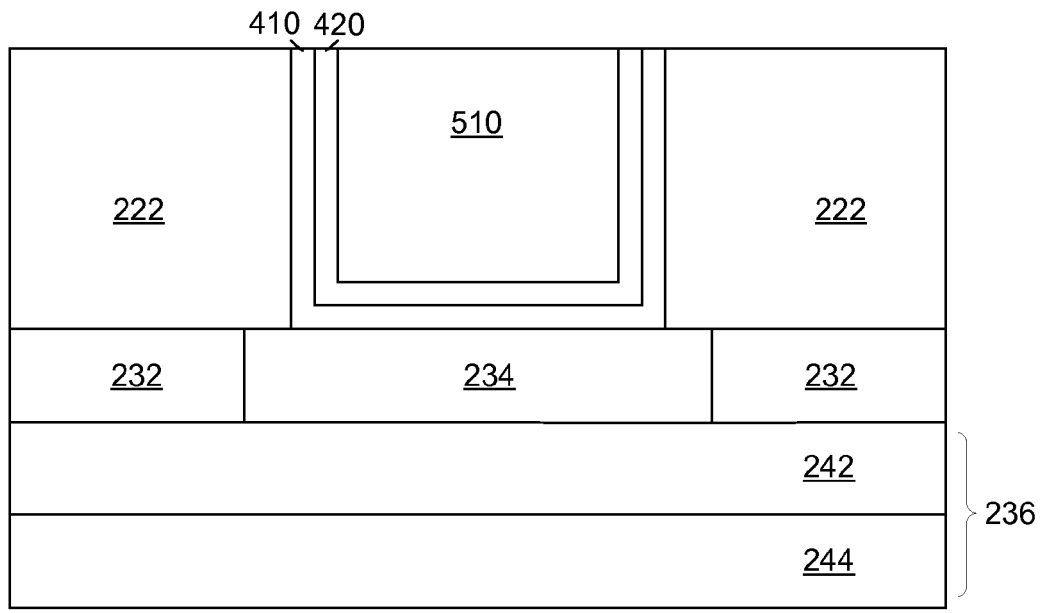
FIG. 11 shows a structure in accordance with an embodiment of the present invention.

Referring to FIG. 11, it is seen that the layer 236 may represent a layer 242 overlying a layer 244. The layer 244 may represent a substrate (for example, be a semiconductor substrate). In one or more embodiments, the conductive layer 234 may represent a conductive interconnect belonging to a metallization level.

Still referring to FIG. 11, if the metal line 234 belongs to a metallization level below the final metallization level, then the conductive feature 610 may represent a conductive via coupling one metallization level to another or coupled a metallization level to a substrate. If the metal line 234 belongs to a final metallization level, the conductive feature 610 may represent a bond pad or an underbump metallization layer disposed over the metal line 234. A bond pad or an underbump metallization may, for example, be formed through a passivation layer of a semiconductor chip.

As noted, referring to FIG. 11, it is seen that the layer 236 may represent a layer 242 overlying a substrate 244. The layer 242 may itself include one or more dielectric layers (such as inter-level dielectric layers) and/or one or more metallization levels and/or one or more conductive vias.

Figure 17:
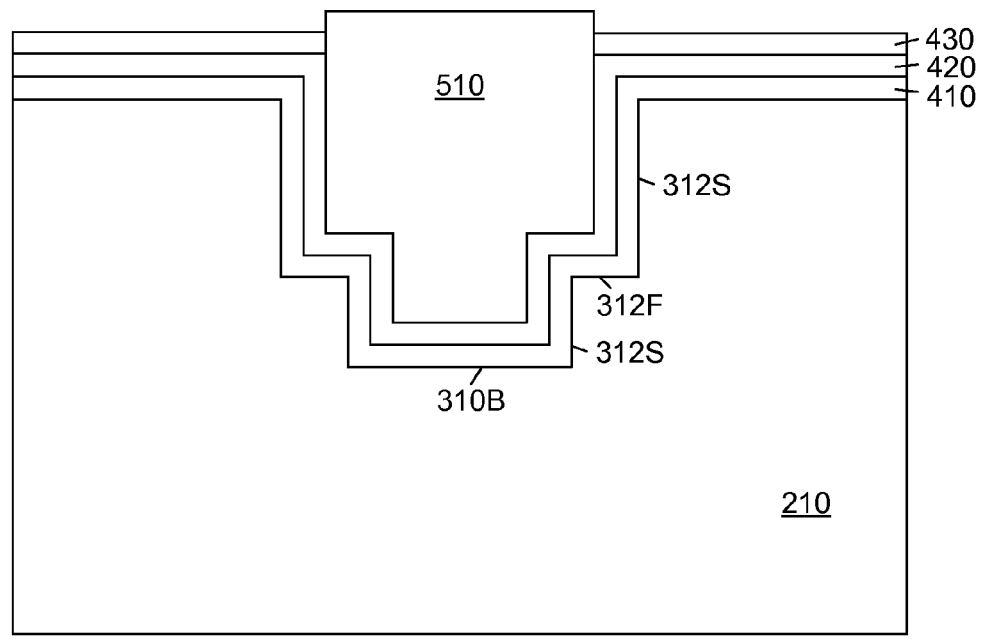
Figure 18:
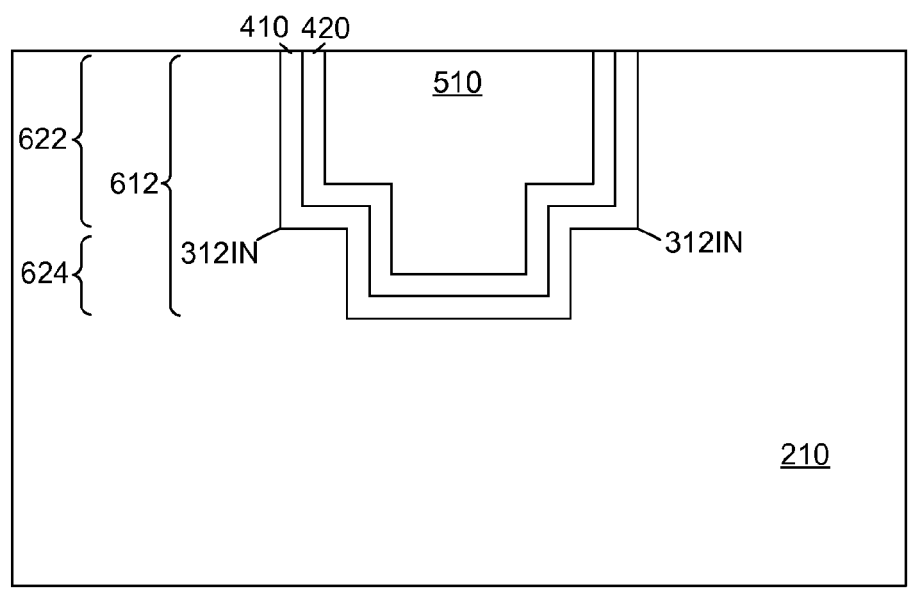

FIG. 18 shows a conductive feature 612 which is another embodiment of the present invention. FIGS. 12 through 18 show a method of making the conductive feature 612.

Figure 12:
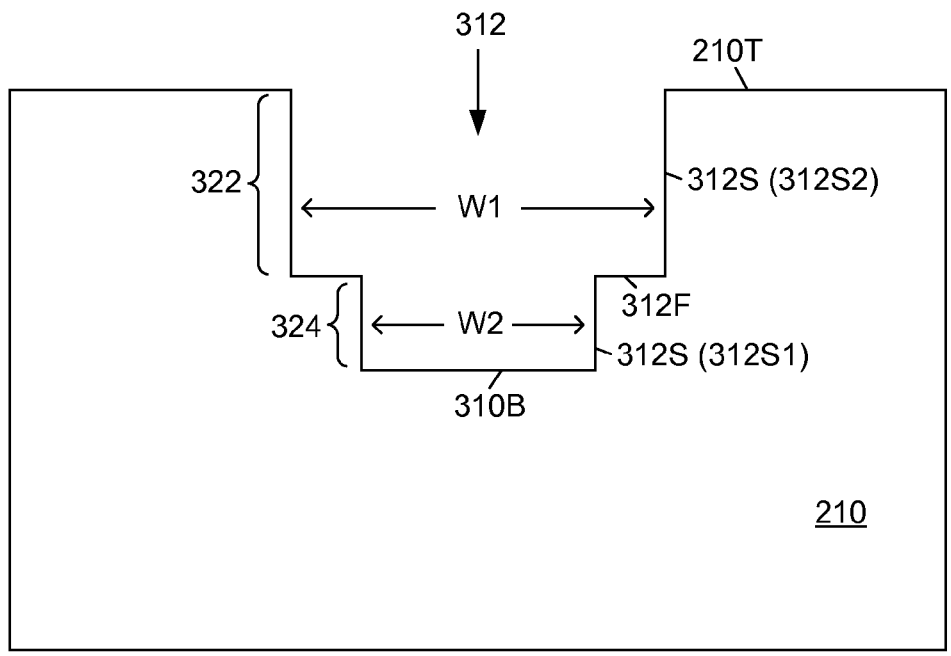
FIGS. 12 through 18 show a method for making a structure in accordance with an embodiment of the present invention.

Referring to FIG. 12, an opening 312 is formed within a workpiece 210. The opening 312 may be a dual-damascene opening. The opening 312 may be formed using two or more masking steps.

The opening 312 includes a bottom surface 312B, sidewall surfaces 312S and a floor surface 312F. Opening 312 includes an upper portion 322 and a lower portion 324.

The upper portion 322 of opening 312 may also be viewed as an opening. Likewise, the lower portion 324 may also be viewed as an opening. The upper portion 322 may be an opening such as a trench or a hole having a bottom surface 312F as well as one or more sidewall surfaces 312S. Hence, the floor surface 312F of opening 312 may be the bottom surface of the opening 322. In one or more embodiments, the upper portion 322 may be useful for the formation of a metal line of a metallization level.

The lower portion 324 may be an opening such as a trench or a hole having a bottom surface 312B as well as one or more sidewall surfaces 312S. In one or more embodiments, the lower portion 324 may be useful for the formation of a conductive via.

In one or more embodiments, the upper portion 322 may have a width of W1 while the lower portion may have a width of W2. In one or more embodiments, the width W1 may be greater than the width W2. In one or more embodiments, the opening 312 may have a width of about 1 µm (micron) or greater. In one or more embodiments, the opening 312 may have a width of about 1.5 µm (microns) or greater. In one or more embodiments, the opening 312 may have a width of about 2 µm (microns) or greater.

In one or more embodiments, the upper portion 322 may have a width of W1 while the lower portion 324 may have a width of W2. In one or more embodiments, W1 may be greater than W2. The entire opening 312 may have a width W1. The entire opening 312 may have a minimum width W2.

In one or more embodiments, the opening 312 may have a width of about 1 µm (micron) or greater. In one or more embodiments, the opening 312 may have a width of about 1.5 µm (microns) or greater. In one or more embodiments, the opening 312 may have a width of about 2 µm (microns) or greater.

In one or more embodiments, the opening 312 may have a minimum width of about 1 µm (micron) or greater. In one or more embodiments, the opening 312 may have a minimum width of about 1.5 µm (microns) or greater. In one or more embodiments, the opening 312 may have a minimum width of about 2 µm (microns) or greater. In one or more embodiments, process steps similar in concept to those depicted in FIGS. 1 through 8 may be applied to the opening 312 shown in FIG. 12 (or to openings having other shapes). Hence, in one or more embodiments, similar processing steps may be followed as shown in FIGS. 1 through 8 except that the opening 312 replaces the opening 310 (shown in FIG. 2).

Figure 13:
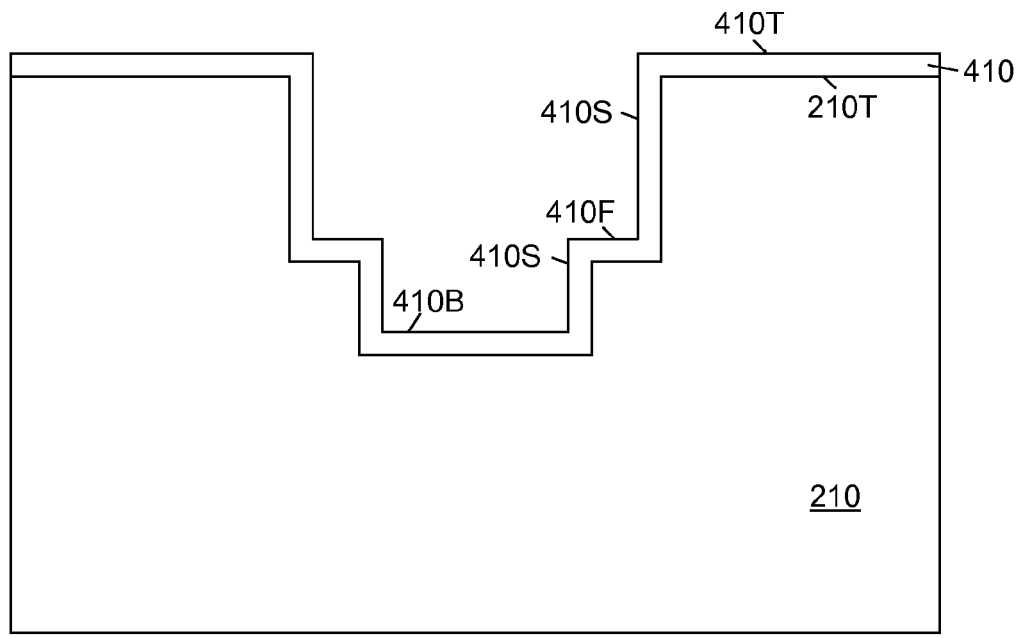

FIGS. 13 through 18 provide an example of a possible process sequence which may be applied to the structure shown in FIG. 12. Referring to FIG. 13, a barrier layer 410 may be formed over the top surface 210T of the workpiece 210 as well as over the sidewall surfaces 312S, bottom surface 312B and floor surface 312F of opening 312. The barrier layer 410 may include a top surface 410T, one or more sidewall surfaces 410S, a bottom surface 410B and a floor surface 410F.

Figure 14:
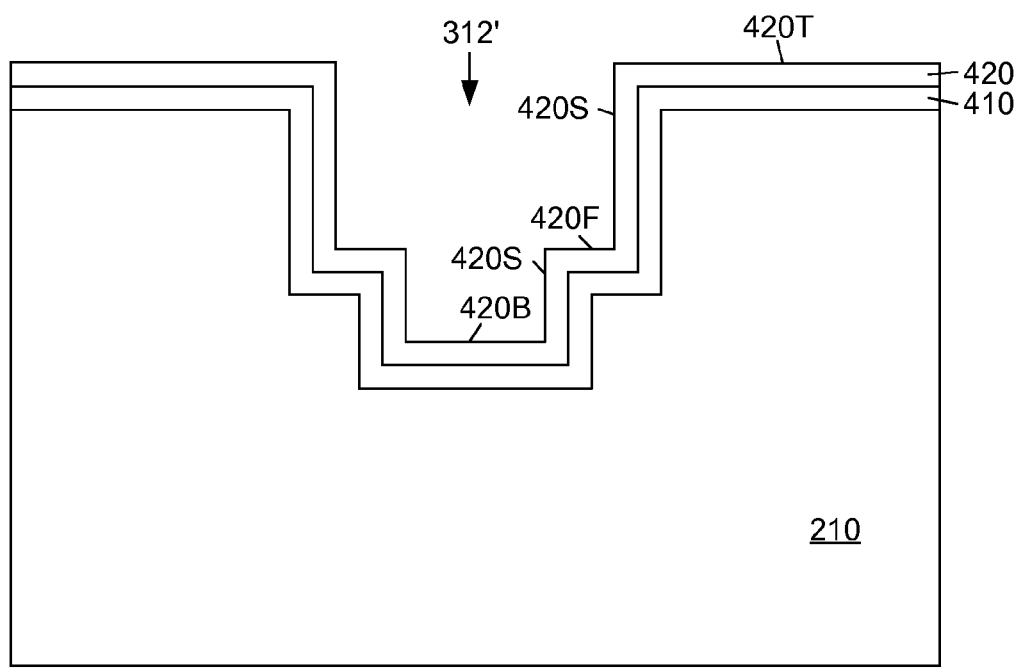
Figure 15:
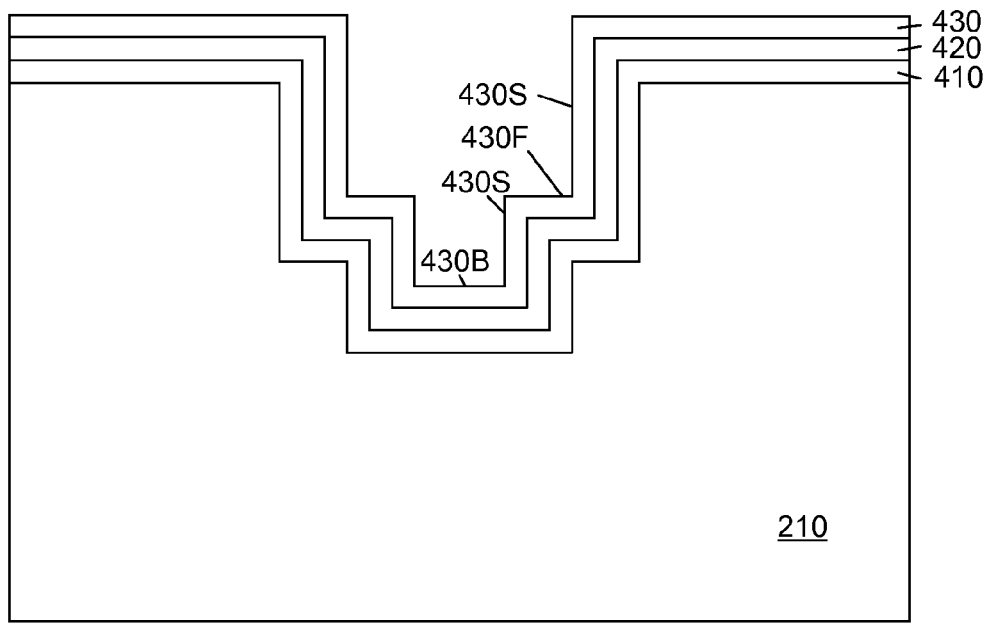

Referring to FIG. 14, a seed layer 420 may then be formed over the top, sidewall, bottom and floor surfaces of the barrier layer 410. The seed layer 420 includes a bottom surface 420B, a floor surface 420F and sidewall surfaces 420S. After the formation of the seed layer 420, an opening 312' may be formed having a bottom surface 420B, a floor surface 420F and sidewall surfaces 420S. Referring to FIG. 15, an inhibitor layer 430 may be deposited over the seed layer 420. The seed layer 420 may include top surface 420T, sidewall surfaces 420S, bottom surface 420B and floor surface 420F.

Referring to FIG. 15, an inhibitor layer 430 may be formed over the top surface 420T, the sidewall surfaces 420S, bottom surface 420B and floor surface 420F of the seed layer 420. From the perspective of opening 312', the inhibitor layer 430 may be formed within the opening 312 as well as outside the opening 312. From the perspective of opening 312, the inhibitor layer 430 may be formed within the opening 312 as well as outside the opening 312.

Figure 16:
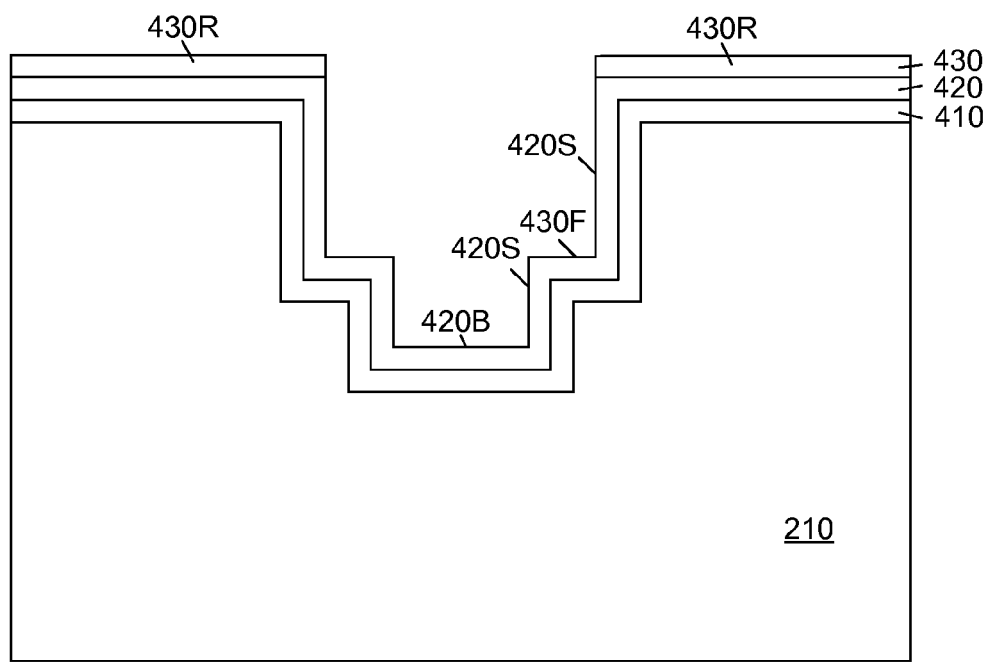

Referring to FIG. 16, a portion of the inhibitor layer 430 may then be removed. From the perspective of the opening 312', at least a portion of the inhibitor layer may be removed from within the opening 312'. In one or more embodiment, substantially all of the inhibitor layer may be removed from within the opening 312'.

Hence, the inhibitor layer may be removed from at least a portion of the bottom surface 420B of the seed layer. In some embodiments, the inhibitor layer may be removed from substantially all (or all) of the bottom surface 420B. In some embodiments, the inhibitor layer may be removed from the bottom surface of the 420B of the seed layer 420 and may additionally be removed from at least a portion of the sidewall surfaces 420S and floor surface 420F of the seed layer 420. In one or more embodiments, the inhibitor layer 430 may be removed from the bottom surfaced 420B and may additionally be removed from substantially all (or all) of the sidewall surfaces 420S and floor surface 420F of the seed layer 420. It is understood that other embodiments are possible.

The removal of a portion of the inhibitor layer 430 may leave a remaining portion 430R of the inhibitor layer 430. In one or more embodiments, the remaining portion 430R may overlie at least a portion of the top surface 420T of the seed layer 420. In one or more embodiments, the remaining portion 430R of the inhibitor layer 430 may overlie substantially all (or all) of the top surface 420T of the seed layer 420. It is possible that some amount of the inhibitor layer may overlie, for example, a portion of sidewall surfaces 420S.

From the perspective of the opening 312, in some embodiments, at least a portion of the inhibitor layer may be removed that lies within the opening 312. In some embodiments, substantially all of the inhibitor layer may be removed from within the opening 312. Removing a portion of the inhibitor layer may leave a remaining portion 430R of the inhibitor layer 430. At least a portion of this remaining layer 430R may outside the opening 312.

As noted above, a portion of the inhibitor layer 430 may be removed in different ways. As explained above, an example of one possible way is to use laser ablation.

Referring to FIG. 17, a fill layer 510 may be formed within the opening 312. In one or more embodiments, it may at least partially fill the opening 312. In one or more embodiments, the fill layer 510 may be formed over the bottom surface 420B, sidewall surfaces 420S and floor surface 420F of the seed layer 420. As described herein, the fill layer 510 may be formed in different ways that include deposition and/or growth mechanisms. Examples have been provided above. As noted, the fill layer 510 may be deposited by a selective deposition process. Also, as noted, examples of deposition process include electroplating processes, electroless plating processes and chemical vapor deposition processes. In one or more embodiments, substantially none of the fill layer 510 may be able to form on the remaining portion 430R of the inhibitor layer 430.

Referring to FIG. 18, the remaining portion 430R of the inhibitor layer 430 as well a portion of the seed layer 420 and a portion of the barrier layer 410 may then be removed. The removal may be accomplished by a chemical mechanical polishing process and/or an etching process. The structure shown in FIG. 18 shows a conductive feature 612 disposed in the workpiece 210. In one or more embodiments, the process for making the conductive feature 612 may include a dual-damascene process.

The conductive feature 612 shown in FIG. 18 includes an upper portion 622 and a lower portion 624. The upper portion 622 may be an upper conductive sub-feature. The lower portion 624 may be a lower conductive sub-feature. The upper portion 622 may be wider than the lower portion 624.

Figure 19:
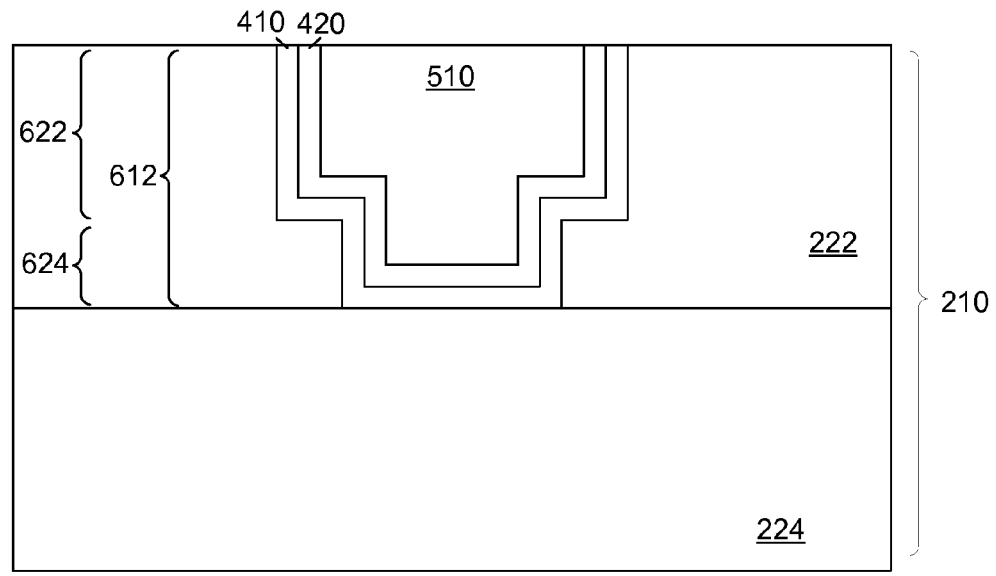
FIG. 19 shows a structure in accordance with an embodiment of the present invention.

Referring to FIG. 19, the workpiece 210 includes a dielectric layer 222 disposed over a workpiece 224. In one or more embodiments, the workpiece 224 may represent a substrate. In this case, the upper portion 622 (e.g. upper conductive sub-feature) may represent a metal line formed in a metallization level (such as metal-1) while the lower portion 624 may represent a conductive via coupling the metal line 622 to the substrate 224.

Figure 20:
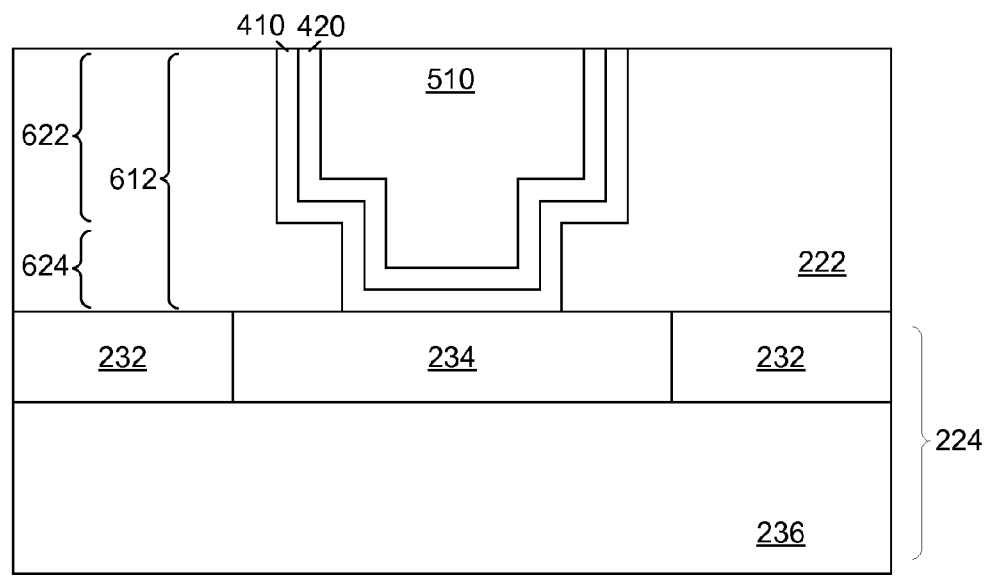
FIG. 20 shows a structure in accordance with an embodiment of the present invention.

Referring to FIG. 20, in one or more embodiments, the layer 224 may comprise a dielectric layer 232 overlying a layer 236. A conductive layer 234 may be disposed within the dielectric layer 232. The conductive layer 234 may represent a metal line of a metallization layer.

Figure 21:
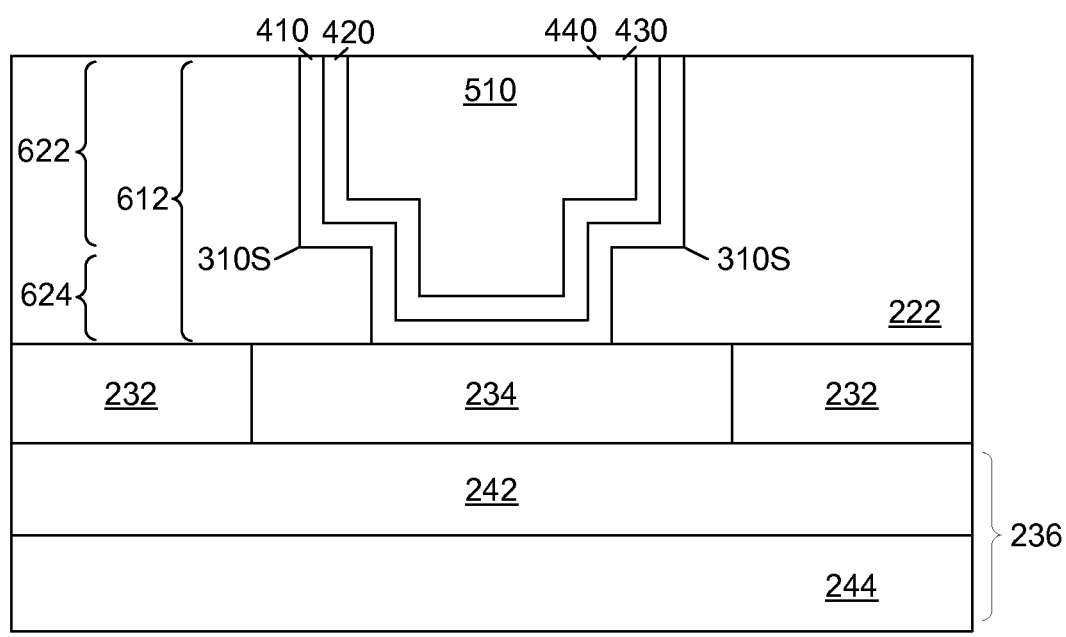
FIG. 21 shows a structure in accordance with an embodiment of the present invention.

Referring to FIG. 21, it is seen that the layer 236 may represent a layer 242 overlying a substrate 244. As noted, the conductive layer 234 may represent a metal line of a metallization level. The layer 242 may include one or more dielectric layers and may include one or more metallization levels.

Still referring to FIG. 21, as noted above, the conductive feature 612 includes an upper portion 622 (e.g. a upper sub-feature) overlying a lower portion 624 (e.g. a lower sub-feature). In one or more embodiments, the upper portion 622 may represent a metal line of a metallization level. In this case, the lower portion 624 may represent a conductive via that electrically couples the metal line 622 (of a first metallization level) to the conductive interconnect 234 (of a second metallization level).

Still referring to FIG. 21, it is also possible that the conductive layer 234 represent a metal line belonging to the final metallization level. In this case, it is possible that the conductive feature 612 may represent a conductive pad or an under-bump metallization. It is also possible that the conductive layer 234 represent a conductive pad while the conductive feature 612 represent a conductive (or metallic) bump. It is also possible that the conductive layer 234 represent a conductive pad while the conductive sub-feature 622 represents a redistribution line or wire and the conductive sub-feature 624 represents a conductive via connecting the redistribution line 622 with the pad 234.

Figure 22:
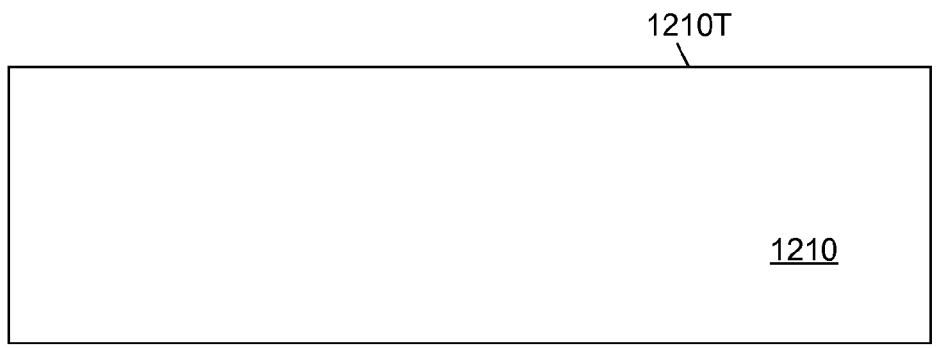
FIGS. 22 through 28 show a method for making a structure in accordance with an embodiment of the present invention.
Figure 27:
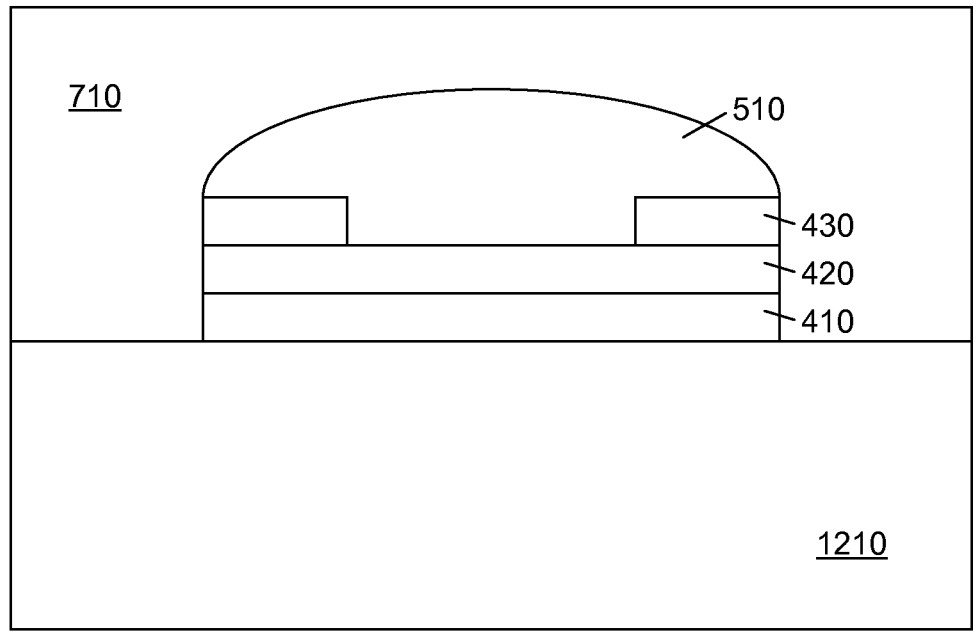
Figure 28:
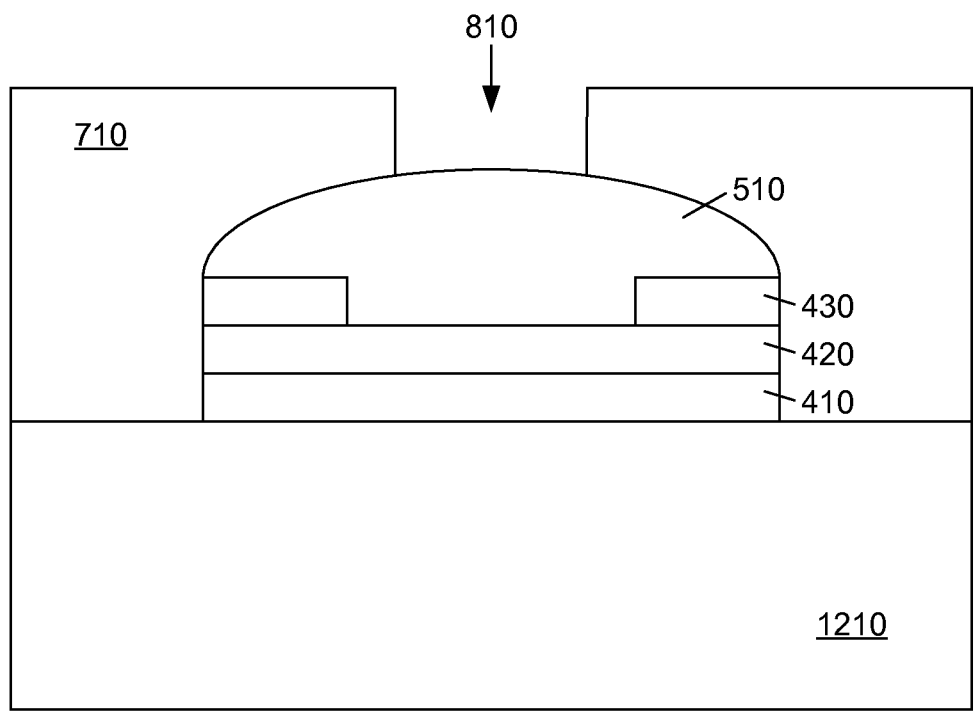

FIG. 28 shows a structure which is another embodiment of the present invention. FIG. 22 through shows a process for making the structure shown in FIG. 28. The process depicted in FIGS. 22 through 28 is also an embodiment of the present invention.

FIG. 22 shows a workpiece 1210. In one or more embodiments, the workpiece 1210 may be part of a semiconductor structure or it may include a semiconductor structure. In one or more embodiments, the workpiece may, for example, be part of an electronic device.

In one or more embodiments, it is possible that workpiece 1210 consists essentially of a homogeneous material. In one or more embodiments, it is possible that the workpiece 1210 comprises two or more layers of different materials. In one or more embodiments, it is possible that the workpiece 1210 comprises a silicon wafer with chips. The chips may consist of an electrical circuitry with transistor devices and a multi-level interconnect architecture. In one or more embodiments, it is possible that the workpiece 1210 comprises a laminate or a printed circuit board (PCB) with one or more levels of interconnects connected by vias. In one or more embodiments, it is possible that the workpiece 1210 comprises a panel with photo-voltaic cells. The workpiece 1210 may, for example, be any workpiece or layer. In one or more embodiments, the workpiece 1210 may correspond to workpiece 210 shown in FIG. 1. In one or more embodiments, the workpiece 1210 may correspond to layer 224 shown in FIG. 19.

Referring to FIG. 22, the workpiece 1210 includes a top surface 1210T. In the embodiment shown in FIG. 22, the top surface 1210T may define the upper contour of the workpiece 1210. In one or more embodiments, the workpiece 1210 may have a substantially planar top surface and a substantially planar upper contour. In one or more embodiments, the workpiece 1210 may having a top surface and upper contour that conforms (e.g. take the shape) of an underlying substrate (e.g. semiconductor substrate).

Figure 23:
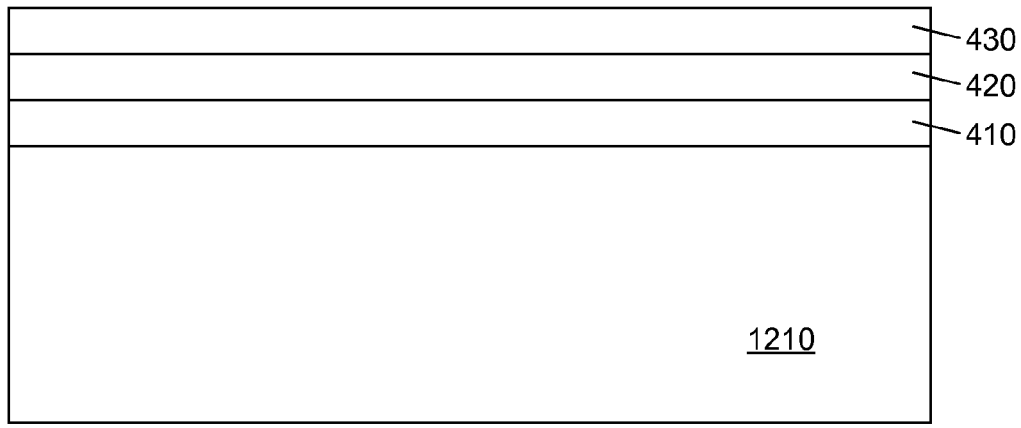

Referring to FIG. 23, a barrier layer 410 may be formed over the workpiece 1210. In one or more embodiments, the barrier layer 410 may be formed directly on the workpiece 1210. A seed layer 420 may be formed over the barrier layer 410. An inhibitor layer 430 may be formed over the seed layer 420.

Referring to FIG. 23, in one or more embodiments, the barrier layer 410 may be formed over a substantially planar surface. In one or more embodiments, the barrier layer 410 may be formed over surface that substantially conforms to an underlying substrate.

Figure 24:
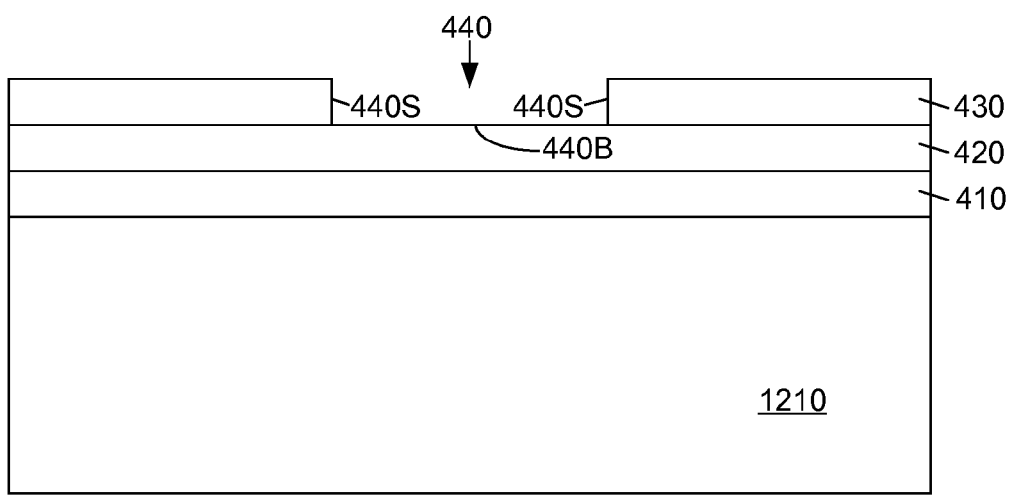

Referring to FIG. 24, a portion of the inhibitor layer 430 may be removed so as to form an opening 440 to expose a portion of the seed layer 430. A portion of the inhibitor layer 430 may be removed by energy such as thermal energy or electromagnetic energy. The electromagnetic energy may be optical or laser energy. In one or more embodiments, the inhibitor layer 430 may be removed using a laser ablation process. In one or more embodiments, a portion of the inhibitor layer 430 may be removed in other ways, such as by an etching process. The etching process may include a dry etching process and/or a wet etching process. The inhibitor layer may be removed so that, in one or more embodiments, substantially none of the underlying seed layer is removed. In one or more embodiments, the removal of the inhibitor layer may be by a selective removal process.

In one or more embodiments, substantially all of the exposed portion of the seed layer 430 may overlie the top surface of the workpiece 1210. In one or more embodiments, substantially all of the exposed portion of the seed layer 430 may be substantially planar.

The opening 440 shown in FIG. 24 includes a bottom surface corresponding to a top surface of the seed layer 420. The opening 440 includes one or more sidewall surfaces 440S which corresponding to sidewall surfaces of the inhibitor layer 430. The sidewall surface 440S may correspond to the thickness of the inhibitor layer. The opening 440 include a bottom surface 440B. The bottom surface 440B may correspond to the exposed surface of the seed layer 420. In one or more embodiments, the opening 440 may have an aspect ratio wherein the width of the opening 440 is greater than the depth of the opening 440.

The depth of the opening 440 may correspond to the thickness of the inhibitor layer.

Figure 25:
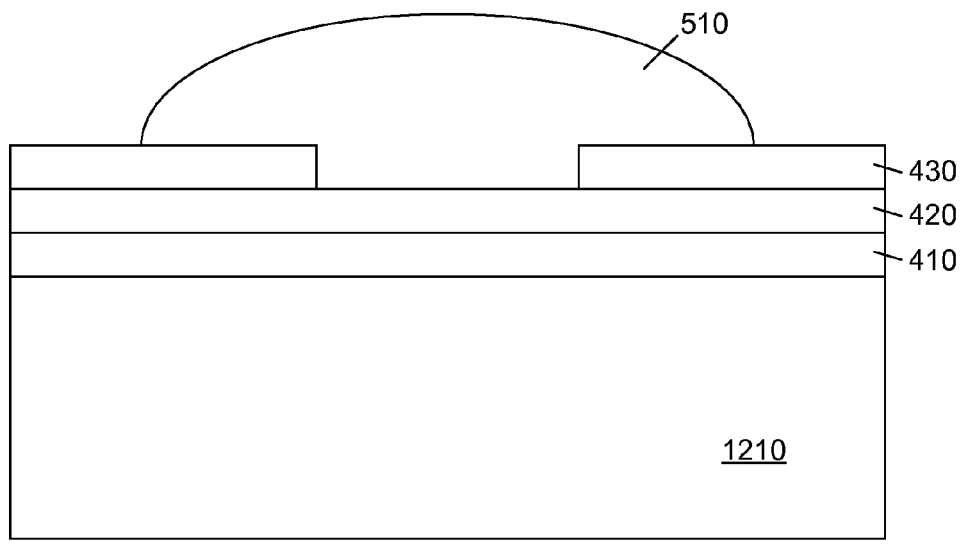

Referring to FIG. 25, a fill layer 510 may then be formed over the exposed portion of the seed layer 420. The fill layer 510 may be formed within the opening 440. A portion of the fill layer 510 may rise above the opening 440 and may spill over a remaining portion of the inhibitor layer 430. The fill layer 510 may be formed, for example, by a growth process and/or by deposition process.

The fill layer 510 may be formed by a selective formation process. For example, the fill layer 510 may form on the exposed portion of seed layer 420. However, substantially none of the fill layer 510 may form on the inhibitor layer. However, it is still possible that some fill layer spills over the inhibitor layer and overlies the inhibitor layer.

The formation process (e.g. deposition and/or growth) used to form the fill layer 510 forms the fill layer only on the material of the exposed seed layer 420 and on the already previously formed material of the fill layer 510. As soon as the thickness of the already formed fill layer material 510 is thicker than the thickness of the inhibitor layer 430 the continued formation (e.g. deposition and/growth) of the fill layer material 510 may lead to a lateral spillover of the subsequently formed fill material 510 over the inhibitor layer 430. This spillover may have a lateral and a vertical growth component with respect to the inhibitor layer 430. This spillover may happen already in an early stage of the formation, because the thickness of the inhibitor layer 430 may, for example, be between about 5 nm and about 200 nm, while the thickness of the fill layer 510 may be between about 100 nm and about 50 μm (or even more). This spillover or overgrowth may happen because of a continued selective nucleation and/or growth of the fill material 510 on previously deposited or grown fill material 510. There is still no nucleation and/or growth of the fill material on the inhibitor layer 430. Even a narrow gap or seam may be visible between the inhibitor layer 430 and the spillover or overgrowth of the fill material 510.

In one or more embodiments, the fill layer 510 may be formed by a selective deposition process. The selective deposition process may include an electroplating process and/or an electroless plating process and/or a selective chemical vapor deposition (CVD) process. The fill layer 510 may be deposited (e.g. selectively deposited) onto the exposed surface of the seed layer 420. It is noted that the inhibitor layer 430 may prevent or discourage the fill layer 510 from being deposited onto the inhibitor layer 430.

Figure 26:
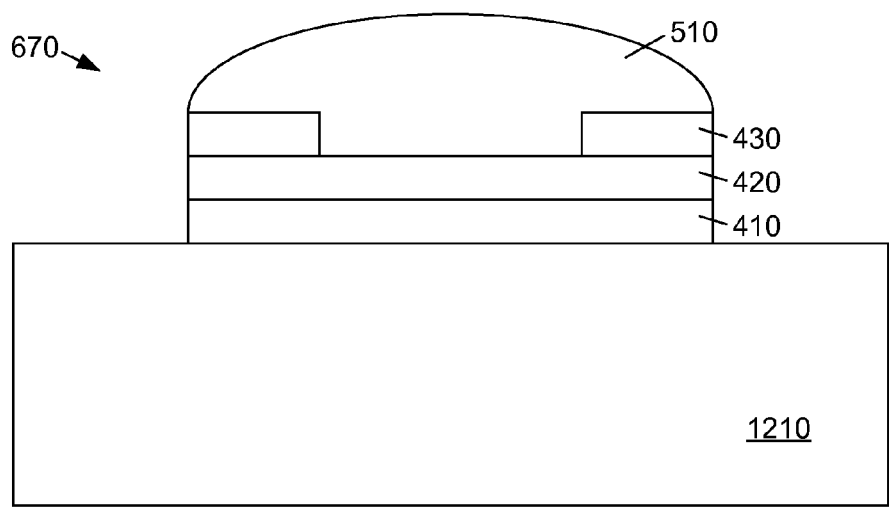

Referring to FIG. 26, the fill layer 510 (including the spillover portion) may be used as a mask to remove portions of the barrier layer 410, seed layer 420 and inhibitor layer 430 that lie laterally outside of the fill layer 510. This is shown in FIG. 26, where a portion of each of the barrier layer 410, seed layer 420 and barrier layer 430 may be removed which do not underlie the fill layer 510. This removal may be accomplished by a etching process. The etching process may include a dry etching process and/or a wet etching process. A conductive feature 670 is thus formed. The conductive feature 670 may, for example, serve as a metal line of a metallization level. As noted, the metal line may include a pad (e.g. bond pad, contact pad, landing pad, etc). The conductive feature 670 may represent a pad or an under-bump metallization. The conductive feature 670 may represent, for example, a bump, a post or a pillar. The conductive feature 670 may represent a portion of a redistribution layer (e.g. an RDL). The conductive feature 670 may represent a trace of a redistribution layer. The redistribution layer may, for example, be used in a wafer level package (WLP) in a wafer level ball grid array (WLB) packaging system. The redistribution layer may, for example, be used in a fan-in WLB or a fan-out eWLB wafer level package.

Referring to FIG. 27, a dielectric layer 710 may be formed over structure shown in FIG. 26 to form the structure shown in FIG. 27. The dielectric layer 710 may be formed over the fill layer 510. The dielectric layer 710 may comprise at least one dielectric material. The dielectric layer 710 may be useful for electrical isolation of the fill layer 510. The dielectric layer 710 may also be useful as a diffusion barrier layer in order to prevent the out-diffusion of copper ions from the fill layer. Examples of possible materials include, without limitation, silicon nitride, SiC, SiCN, silicon oxide, fluorinated silicon oxide (FSG), a dense or porous low-k dielectric material (inorganic or organic), a polyimide, a BCB, a PBO, a WPR or some combination of thereof. The dielectric material may be deposited by chemical vapor deposition, spin-on, lamination or any other appropriate deposition process. In some embodiments, a low-k dielectric may have a dielectric constant less than that of silicon dioxide.

Referring to FIG. 28, an opening 810 may be formed within the dielectric layer 710. The opening 810 may expose the fill layer 510.

The workpiece 1210 shown in FIGS. 22 through 28 may represent a homogeneous layer or it may represent a plurality of layer of different materials. For example, the workpiece 1210 may itself represent a substrate (such as a semiconductor substrate) or it may represent one or more layers overlying a substrate.

Figure 29:
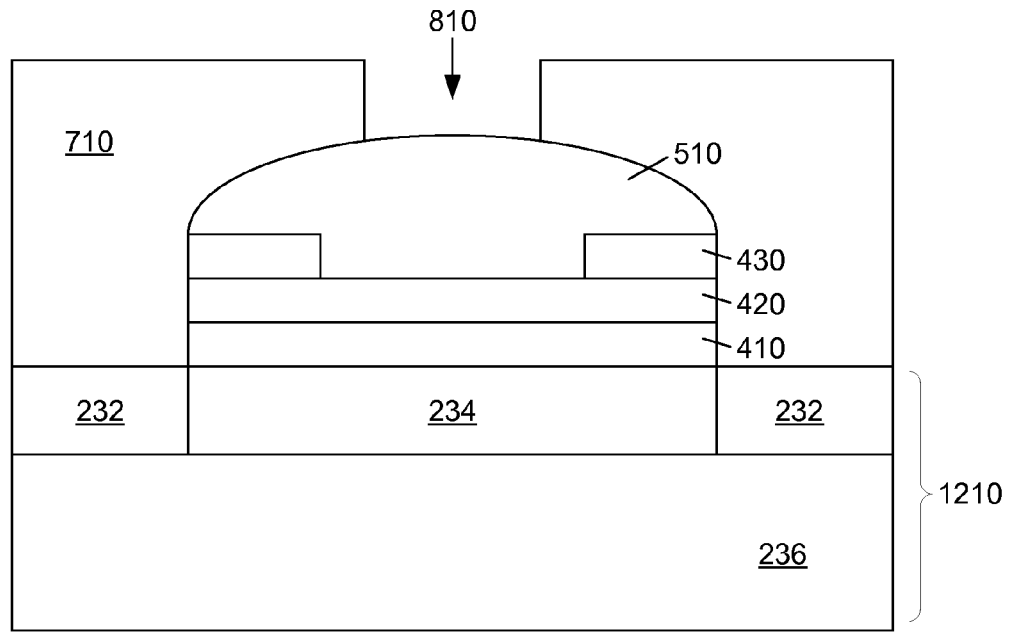
FIG. 29 shows a structure in accordance with an embodiment of the present invention.

Referring to FIG. 29, in one or more embodiments, the workpiece 1210 may comprise a dielectric layer 232 overlying a layer 236. A conductive layer 234 may be disposed within the dielectric layer 232. The conductive layer 234 may represent a metal line of a metallization layer. In one or more embodiments, the layer 236 may represent a substrate.

Figure 30:
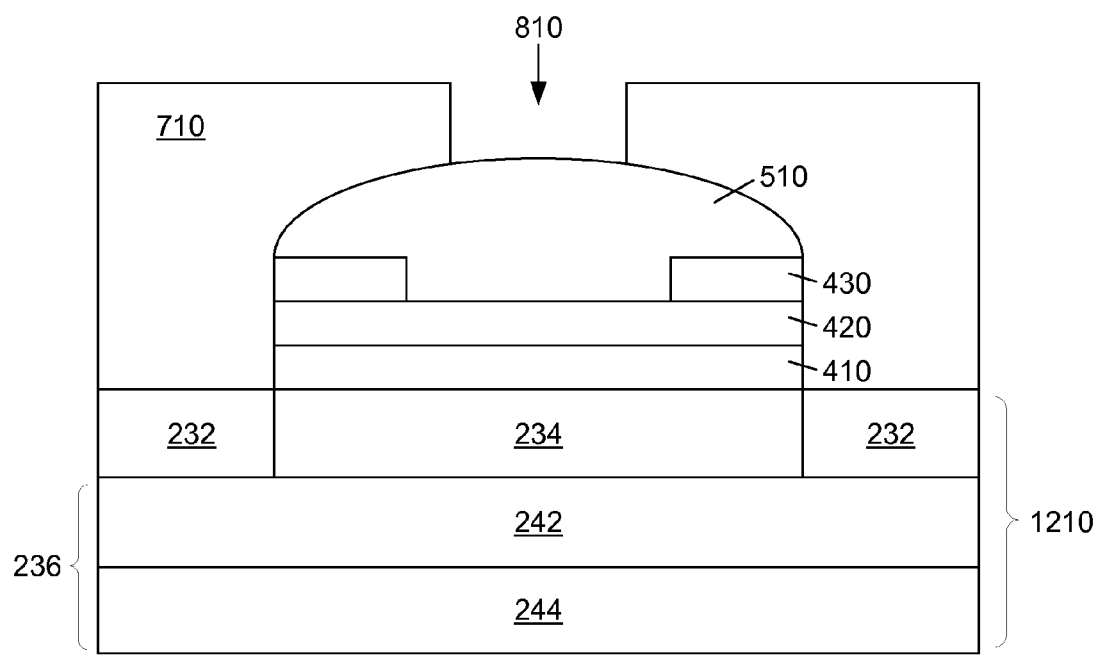
FIG. 30 shows a structure in accordance with an embodiment of the present invention.

Referring to FIG. 30, it is seen that the layer 236 may represent a layer 242 overlying a substrate 244. The layer 242 may include one or more dielectric layers and may include one or more metallization levels.

Referring again to FIG. 24, it is observed that removal of a portion of inhibitor layer 430 creates an opening 440 and exposed a portion of the seed layer. The opening 440 may be viewed as having a bottom surface 440B and at least one sidewall surface 440S. In the embodiment shown, the bottom surface 440B corresponds to a top surface of the seed layer 420 and the sidewall surface(s) 440S of opening 440 correspond to sidewalls (in the thickness dimension) of the inhibitor layer 430.

In addition, in one or more embodiments, substantially all of the exposed portion of seed layer 420 may overlie a top surface 1210T of workpiece 1210 and may be substantially parallel with the underlying top surface 1210T of workpiece 1210. Likewise, the same exposed portion of the seed layer 420 may be substantially parallel with an underlying substrate (e.g. a semiconductor substrate) which may be part of the workpiece 1210. Hence, it may conform to the contour of the substrate. In one or more embodiments, the top surface of the workpiece 1210 may be substantially planar.

In addition, in one or more embodiments, it is possible that the exposed portion of the seed layer 420 may be substantially planar. In one or more, the exposed portion of seed layer 420 may be substantially horizontal.

In some embodiments, one or more of the barrier layer 410, seed layer 420, inhibitor layer 430 or fill layer 440 may be conductive layers. In some embodiments, one or more of these layers may be homogeneous layers. In some embodiments, one or more of these layers may be heterogeneous layers. Any of these conductive layers as well as any other conductive layer described herein (such as, for example, conductive layer 234) may comprise one or more conductive materials. A conductive material may be a metallic material. In one or more embodiments, a metallic material may, for example, include a metal, a metallic alloy and/or a metallic compound.

In one or more embodiments, a metallic alloy may include two or more metallic elements. In one or more embodiments, a metallic alloy may include at least one metallic element and at least one non-metallic element.

The metallic material may include one or more Periodic Table elements such as Cu (copper), Al (aluminum), W (tungsten), Au (gold), Ag (silver), Pt (platinum), Ni (nickel), Sn (tin), V (vanadium), Pb (lead), Pd (palladium), Ti (titanium), Ta (tantalum), and Ru (rubidium). Examples of metallic materials which may be used include, but are not limited to, copper metal, copper alloy, copper compound, aluminum metal, aluminum alloy, aluminum compound, tungsten metal, tungsten alloy, tungsten compounds, silver metal, silver alloy, silver compounds, gold metal, gold alloy, gold compounds, tin metal, tin alloy, tin compounds, titanium metal, titanium alloy, titanium compounds, tantalum metal, tantalum alloy, tantalum compounds, rubidium metal, rubidium alloy, or rubidium compounds. Additional examples of materials include tantalum nitride (e.g., TaN), tantalum silicon nitride (e.g. TaSiN), titanium nitride (e.g. TiN), titanium-tungsten (e.g. TiW), tungsten nitride (e.g. WN), or RuTa.

In some embodiments, certain materials may be better suited than others for particular layers described herein.

In one or more embodiments, the barrier layer 410 (as shown, for example, in FIGS. 8, 18, 28, 29 and 30) may serve as a diffusion barrier layer and/or as an adhesion layer. In one or more embodiments, the barrier layer 410 may be a conductive layer. In one or more embodiments, the barrier layer 410 may be a metallic layer. The barrier layer 410 may be a homogeneous layer or a heterogeneous layer. The barrier layer 410 may comprise one or more conductive materials. In one or more embodiments, a conductive material may be a metallic material. In one or more embodiments, a metallic material may include a metal and/or a metal alloy and/or a metallic compound. A metallic material for barrier applications may include one or more Periodic Table elements such as W (tungsten), Ti (titanium), Ta (tantalum), Ni (nickel), V (vanadium), Pd (palladium), Co (cobalt), Mo (molybenum) and Ru (rubidium). The elements may be in any form such a metal, a metallic alloy or a metallic compound.

As an example, the barrier layer 410 may include the chemical element Ta (tantalum). The Ta (tantalum) may exist in any form. Hence, the barrier layer 410 may include any Ta-containing material (e.g. any material that includes Ta atoms). This may be, for example, a tantalum metal, a tantalum alloy and/or a tantalum compound.

The barrier layer 410 may include, for example, alpha-tantalum and/or beta-tantalum. The alpha-tantalum may have a body centered cubic lattice structure. In some embodiments, the alpha-tantalum may be a pure alpha-tantalum. A pure alpha-tantalum may include impurities (e.g. trace impurities). In some embodiments, the alpha-tantalum may be a doped alpha-tantalum that includes impurities (e.g. more than trace impurities). The dopant may, for example, be nitrogen. Other examples of dopants include, but not limited to, carbon and silicon. In some embodiments, the barrier layer 410 may include, for example, pure alpha-tantalum and/or doped alpha-tantalum.

It is noted that a barrier layer may include a metallic compound. The barrier layer may include, for example, tantalum nitride (for example, TaN). As another example, the barrier layer may comprise tantalum silicon nitride (e.g. TaSiN).

Examples of materials which may be used as barrier layer materials include, but are not limited to tungsten metal, tungsten alloys, tungsten compounds, titanium metal, titanium alloys, titanium compounds, tantalum metal, tantalum alloys, tantalum compounds, nickel metal, nickel alloys, nickel compounds, vanadium metal, vanadium alloys, vanadium compounds, palladium metal, palladium alloys, palladium compounds, cobalt metal, cobalt alloys, cobalt compounds, rubidium metal, rubidium alloys, and rubidium compounds. Particular examples of materials which may be used include, but not limited to, titanium nitride (e.g. TiN), titanium silicon nitride (e.g. TiSiN), titanium-tungsten (e.g. TiW), tungsten nitride (e.g. WN) and tungsten carbon nitride (e.g. WCN). Further examples include CoWP, CoWB, NiMoP, or RuTa.

The barrier layer 410 may include a combination of two or more materials. The barrier layer 410 may include a stack of two or more layers (e.g. sub-layers). For example, the barrier layer 410 may include a tantalum metal/TaN bi-layer. In one or more embodiments, the TaN sub-layer may be proximate to or in contact with the workpiece 210 while the tantalum metal sub-layer may be proximate to or in contact with the seed layer 420. The barrier layer 410 may, for example, be deposited by a physical vapor deposition or a chemical vapor deposition.

In one or more embodiments, the barrier layer may have a thickness between about 20 nm and about 200 nm.

In one or more embodiments, the seed layer 420 (as shown, for example, in FIGS. 8, 18, 28, 29 and 30) may serve as a seed layer for an electroplating process. In one or more embodiments, the seed layer 420 may serve as an activation layer for an electroless plating process. In one or more embodiments, the seed layer may serve as a nucleation layer for a selective CVD deposition process. In one or more embodiments, the seed layer 420 may be a conductive layer. In one or more embodiments, the seed layer 420 may be a metallic layer. The seed layer 420 may comprise one or more conductive materials. In one or more embodiments, any conductive material may be used. The conductive material may be homogeneous or heterogeneous. In one or more embodiments, a conductive material may include a metallic material. In one or more embodiments, the metallic material may include at least one metal and/or at least one metallic alloy and/or at least one metallic compound. The conductive material for the seed layer 420 may include one or more Periodic Table elements such as Cu (copper), Al (aluminum), W (tungsten), Au (gold), Ag (silver), Pt (platinum), Ti (titanium), Ta (tantalum), Ru (rubidium), Pb (lead), and Sn (tin). The elements may exist in any form such as, for example, a metal, a metallic alloy or a metallic compound. Examples of materials which may be used include, but are not limited to, copper metal, copper alloy, aluminum metal, aluminum alloy, tungsten metal, tungsten alloy, silver metal, silver alloy, gold metal, gold alloy, platinum metal, platinum alloy, titanium metal, titanium alloy, tantalum metal, tantalum alloy, rubidium metal, rubidium alloy, lead metal, lead alloy, tin metal, and tin alloy.

In one or more embodiments, the seed layer 420 may be deposited by, for example, physical vapor deposition or chemical vapor deposition. In one or more embodiments, the seed layer may have a thickness between about 50 nm and about 500 nm.

In one or more embodiments, the inhibitor layer 430 may comprise any material which may inhibit or discourage the nucleation or growth of a metallic material during an electroplating process. In one or more embodiments, the inhibitor layer 430 may comprise a material which serves to inhibit or prevent the electroplating and/or electroless plating and/or chemical vapor deposition of the fill layer 510 on the inhibitor layer. Hence, in one or more embodiments, during the electroplating process and/or electroless plating process and/or the selective chemical vapour deposition (CVD) process, the fill layer may only form (e.g., deposit and/or grown and/or plate and/or nucleate and/or activate) on the seed layer 420 and may not form (e.g., deposit and/or grown and/or plate and/or nucleate and/or activate) on the inhibitor layer 430. In one or more embodiments, the inhibitor layer 410 may be a conductive layer. In one or more embodiments, the inhibitor layer 430 may be a metallic layer. In one or more embodiments, the inhibitor layer may be a homogeneous layer. In one or more embodiments, the inhibitor layer may be a heterogenous layer. The inhibitor layer 430 may comprise one or more conductive materials. In one or more embodiments, any conductive material may be used. In one or more embodiments, a conductive material may include a metallic material.

In one or more embodiments, a metallic material may include at least one metal and/or at least one metallic alloy and/or at least one metallic compound.

The conductive material for the inhibitor layer 430 may include one or more Periodic Table elements such as W (tungsten), Ti (titanium), and Ta (tantalum). The elements may exist in any form such as, for example, a metal, a metallic alloy or a compound (e.g. a metallic compound). Examples of materials which may be used as inhibitor layer 430 include, but are not limited to, tantalum metal, tantalum alloys, and tantalum compounds, titanium metal, titanium alloys, titanium compounds, tungsten metal, tungsten alloys, tungsten compounds.

In one or more embodiments, the inhibitor layer 430 may include tantalum nitride, titanium nitride and tungsten nitride. In one or more embodiments, the inhibitor layer 430 may include one or more materials such as TaN, TaSiN, TaC, TiN, TiSiN, TiW, TiC, WN, WC, WCN or RuTa. The inhibitor layer 430 may include a combination of two or more materials.

In one or more embodiments, the inhibitor layer 430 may include the chemical element Ta (tantalum). The Ta (tantalum) may exist in any form. Hence, the inhibitor layer 430 may include any Ta-containing material (e.g. any material that includes Ta atoms). This may be, for example, a tantalum metal, a tantalum alloy and/or a tantalum compound.

The inhibitor layer 430 may include, for example, tantalum metal, tantalum alloy and/or tantalum compound.

The inhibitor layer 410 may include, for example, alpha-tantalum and/or beta-tantalum. The alpha-tantalum may have a body centered cubic lattice structure. In some embodiments, the alpha-tantalum may be a pure alpha-tantalum. A pure alpha-tantalum may include impurities (e.g. trace impurities). In some embodiments, the alpha-tantalum may be a doped alpha-tantalum that includes impurities (e.g. more than trace impurities). The dopant may, for example, be nitrogen. Other examples of dopants include, but not limited to, carbon and silicon.

In some embodiments, the barrier layer 410 may include, for example, pure alpha-tantalum and/or doped alpha-tantalum.

It is noted that the inhibitor layer may include a metallic compound. The inhibitor layer may include, for example, tantalum nitride (for example, TaN). Another example of a tantalum compound is tantalum silicon nitride (e.g. TaSiN).

In one or more embodiments, the inhibitor layer may include a non-conducting material. Examples of non-conducting materials may include but are not limited to silicon oxide, silicon nitride, silicon oxynitride, silicon carbide, silicon carbon nitride, low-K dielectric, and high-K dielectric materials. In one or more embodiments, the inhibitor layer may include an organic material. Examples of organic materials include resist, polyimide, BCB, PBO, etc. In one or more embodiments, the inhibitor layer 430 may be deposited by, for example, a physical vapor deposition or a chemical vapor deposition or by a spin-on deposition or a lamination process.

In one or more embodiments, the barrier layer and the inhibitor layer may comprise the same material. In one or more embodiments, it is conceivable that materials described above for the barrier layer may also be used for the inhibitor layer. In one or more embodiments, the barrier layer and inhibitor layer may comprise a different material.

In one or more embodiments, the fill layer 510 (and/or second fill layer 510') may comprise a material which can be electroplated and/or selectively deposited by an electroless plating process and/or selectively deposited by a chemical vapor deposition process. In one or more embodiments, the fill layer 510 (and/or second fill layer 510') may be a conductive layer. In one or more embodiments, the fill layer 510 (and/or second fill layer) may be a metallic layer. In one or more embodiments, the fill layer 510 (and/or second fill layer) may be a homogeneous layer. In one or more embodiments, the fill layer 510 (and/or the second fill layer may be a heterogeneous layer. The fill layer 510 (and/or second fill layer) may comprise one or more conductive materials. In one or more embodiments, any conductive material may be used. In one or more embodiments, a conductive material may be a homogeneous material. In one or more embodiments, a conductive material may be a heterogeneous material. In one or more embodiments, a conductive material may include a metallic material. In one or more embodiments, a metallic material may include at least one metal and/or at least one metallic alloy and/or at least one metallic compound. The conductive material may include one or more Periodic Table chemical elements such as Cu (copper), Al (aluminum), W (tungsten), Au (gold), Ag (silver), Pt (platinum), Pd (palladium), Ni (nickel), V (vanadium), Ti (titanium), Ta (tantalum), and Ru (rubidium), Pb (lead), and Sn (tin). The elements may exist in any form such as, for example, a metal, a metallic alloy or a compound (e.g. a metallic compound). Examples of materials which may be used include, but are not limited to, copper metal, copper alloy, aluminum metal, aluminum alloy, tungsten metal, tungsten alloy, silver metal, silver alloy, gold metal, gold alloy, platinum metal, platinum alloy, palladium metal, palladium alloy, nickel metal, nickel alloy, vanadium metal, vanadium alloy, titanium metal, titanium alloy, tantalum metal, tantalum alloy, rubidium metal, rubidium alloy, lead metal, lead alloy, tin metal, tin alloy, and solder. Solder may be an alloy comprising Pb (lead) and Sn (tin). In one or more embodiments, the fill layer may comprise the same material as the seed layer. In one or more embodiments, the fill layer may comprise a different material from the seed layer Any of the dielectric layers described herein (such as, for example, dielectric layer 232) may comprise one or more dielectric materials. The dielectric layer may comprise one or more materials selected from the group consisting of an oxide (such as silicon oxide), a carbide (such as silicon carbide), a nitride (such as silicon nitride), and an oxynitride (such as silicon oxynitride). The dielectric layer may comprise a combination or mixture of two or more dielectric materials. In one or more embodiments, it is possible that the dielectric material comprises a low-K dielectric material.

In one or more embodiments, the low-K material may have a dielectric constant smaller than that of silicon dioxide. In one or more embodiments, the low-K material may have a dielectric constant smaller than about 3.9.

In one or more embodiments, the low-K material may have a dielectric constant greater than about 1.0 and smaller than 3.9.

In one or more embodiments, it is possible that the dielectric material comprise a high-K dielectric material. In one or more embodiments, the high-K material may have a dielectric constant greater than that of silicon dioxide. In one or more embodiments, the high-K material may have a dielectric constant greater than that of silicon dioxide. In one or more embodiments, the high-K material may have a dielectric constant greater than about 3.9. In one or more embodiments, the high-K material may have a dielectric constant greater than silicon nitride. In one or more embodiments, the high-K material may have a dielectric constant greater than about 7.0.

One or more embodiments relate to a method of forming a semiconductor structure, comprising: providing a workpiece; forming a barrier layer over the workpiece; forming a seed layer over the barrier layer; forming an inhibitor layer over the seed layer; removing a portion of the inhibitor layer to expose a portion of the seed layer; and selectively depositing a fill layer on the exposed seed layer.

One or more embodiments relate to a method of forming an electronic device, comprising: providing a workpiece; forming a barrier layer over the workpiece; forming a seed layer over the barrier layer; forming an inhibitor layer over the seed layer; removing a portion of the inhibitor layer to expose a portion of the seed layer; and forming a fill layer on the exposed seed layer, substantially none of the fill layer forming on the inhibitor layer.

One or more embodiments relate to a method of forming a semiconductor structure, comprising: providing a workpiece, the workpiece including an opening; forming a barrier layer over the workpiece, the barrier layer formed within the opening; forming a seed layer over the barrier layer; forming an inhibitor layer over the seed layer; removing at least a portion of the inhibitor layer from within the opening so as to expose the seed layer and to leave a remaining portion of the inhibitor layer; and selectively depositing a fill layer on the exposed seed layer.

One or more embodiments relate to a method of forming a semiconductor structure, comprising: providing a workpiece, the workpiece including an opening; forming a barrier layer within the opening; forming a seed layer over the barrier layer; forming an inhibitor layer over the seed layer; removing the inhibitor layer from at least a portion of a bottom surface of the seed layer so as to expose the seed layer, a remaining portion of the inhibitor layer overlying at least top surface of the seed layer; and selectively depositing a fill layer on the exposed portion of the seed layer.

One or more embodiments relate to a method of forming a semiconductor structure, comprising: forming a barrier layer over a substantially planar surface; forming a seed layer over the barrier layer; forming an inhibitor layer over the seed layer; removing a portion of the inhibitor layer to expose a portion of the seed layer; and selectively depositing a fill layer on the exposed seed layer.

One or more embodiments relate to a method of forming a semiconductor structure, comprising: forming a barrier layer over a workpiece; forming a seed layer over the barrier layer; forming an inhibitor layer over the seed layer; removing a portion of the inhibitor layer to expose a portion of the seed layer, the exposed seed layer being substantially planar; and selectively depositing a fill layer on the exposed seed layer.

One or more embodiments relate to semiconductor structure, comprising: a barrier layer overlying a workpiece surface; a seed layer overlying the barrier layer; an inhibitor layer overlying the seed layer, the inhibitor layer having a opening exposing a portion of the seed layer, and a fill layer overlying the exposed portion of the seed layer.

One or more embodiments relate to a semiconductor structure, comprising: a workpiece including a opening a barrier layer overlying a bottom and a sidewall surface of the opening; a seed layer overlying a bottom and a sidewall surface of the barrier layer; an inhibitor layer overlying at least a top surface of the seed layer; a fill layer disposed within the opening and overlies at least a bottom surface of the seed layer. One or more embodiments relate to a semiconductor structure, comprising: a workpiece, the workpiece including a opening; a barrier layer disposed within the opening; a seed layer overlying the barrier layer within the opening; an inhibitor layer overlying the seed layer outside the opening, the seed layer having an exposed portion within the opening; and a fill layer overlying the exposed portion of the seed layer within the opening.

One or more embodiments relate to a semiconductor structure, comprising: a barrier layer overlying a workpiece; a seed layer overlying the barrier layer; an inhibitor layer overlying the seed layer, the inhibitor layer having an opening therethrough so as to expose a portion of the seed layer; and a fill layer overlying the exposed portion of the seed layer.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A method of forming a semiconductor structure, comprising:
    providing a workpiece;
    forming a barrier layer over said workpiece;
    forming a seed layer over said barrier layer;
    forming an inhibitor layer over said seed layer;
    removing a portion of said inhibitor layer to expose a portion of said seed layer; and
    selectively depositing a fill layer on said exposed seed layer,
wherein substantially none of said fill layer selectively deposits on said inhibitor layer.

2. The method of claim 1, wherein said selective deposition includes a process selected from the group consisting of electroplating, electroless plating, and chemical vapor deposition.

3. The method of claim 1, wherein said fill layer spills over said inhibitor layer.

4. The method of claim 1, wherein said removing said portion of said inhibitor layer comprises laser ablation.

5. The method of claim 1, wherein said fill layer and/or said seed layer comprises copper metal and/or a copper alloy.

6. The method of claim 1, wherein said barrier layer and/or said inhibitor layer comprises Ta (tantalum).

7. The method of claim 1, wherein said workpiece includes an opening, said barrier layer formed within said opening.

8. A method of forming an electronic device, comprising:
    providing a workpiece;
    forming a barrier layer over said workpiece;
    forming a seed layer over said barrier layer;
    forming an inhibitor layer over said seed layer;
    removing a portion of said inhibitor layer to expose a portion of said seed layer; and
    forming a fill layer on said exposed seed layer, substantially none of said fill layer forming on said inhibitor layer.

9. The method of claim 8, wherein said workpiece includes an opening, said barrier layer formed within said opening.

10. The method of claim 8, wherein said removing said portion of said inhibitor layer comprises laser ablation.

11. The method of claim 8, wherein said barrier layer and/or said inhibitor layer comprises Ta (tantalum).

12. The method of claim 8, wherein said seed layer and/or said fill layer comprises copper metal and/or copper alloy.

13. A method of forming a semiconductor structure, comprising:
    providing a workpiece, said workpiece including an opening;
    forming a barrier layer over said workpiece, said barrier layer formed within said opening;
    forming a seed layer over said barrier layer;
    forming an inhibitor layer over said seed layer;

removing at least a portion of said inhibitor layer from within said opening so as to expose said seed layer and to leave a remaining portion of said inhibitor layer; and selectively depositing a fill layer on said exposed seed layer, wherein substantially none of said fill layer selectively deposits on said inhibitor layer.

14. The method of claim 13, wherein said selective deposition includes a process selected from the group consisting of electroplating, electroless plating, and chemical vapor deposition.

15. The method of claim 13, wherein said fill layer spills over said inhibitor layer.

16. The method of claim 13, wherein removing said inhibitor layer comprises laser ablation.

17. The method of claim 13, wherein said fill layer and/or said seed layer comprises Cu (copper).

18. The method of claim 13, wherein said barrier layer and/or said inhibitor layer comprises Ta (tantalum).

19. The method of claim 13, wherein at least a part of said remaining portion of said inhibitor layer is outside said opening.

20. A method of forming a semiconductor structure, comprising:

providing a workpiece, said workpiece including an opening;

forming a barrier layer within said opening;

forming a seed layer over said barrier layer;

forming an inhibitor layer over said seed layer;

removing said inhibitor layer from at least a portion of a bottom surface of said seed layer so as to expose said seed layer, a remaining portion of said inhibitor layer overlying at least top surface of said seed layer; and selectively depositing a fill layer on said exposed portion of said seed layer, wherein substantially none of said fill layer selectively deposits on said remaining portion of said inhibitor layer.

21. The method of claim 20, wherein removing said inhibitor layer removes said inhibitor layer from at least said bottom surface of said seed layer.

22. The method of claim 21, wherein removing said inhibitor layer removes said inhibitor layer from at least a portion of said sidewall surface.

23. The method of claim 21, wherein removing said inhibitor layer removes said inhibitor layer from substantially all of said sidewall surface of said seed layer.

24. The method of claim 20, wherein said removing said inhibitor layer comprises laser ablation.

25. The method of claim 20, wherein said fill layer and/or said seed layer comprises copper metal and/or a copper alloy.

26. The method of claim 20, wherein said barrier layer and/or said inhibitor layer comprises Ta (tantalum).

27. A method of forming a semiconductor structure, comprising:

forming a barrier layer over a substantially planar surface;

forming a seed layer over said barrier layer;

forming an inhibitor layer over said seed layer;

removing a portion of said inhibitor layer to expose a portion of said seed layer; and selectively depositing a fill layer on said exposed seed layer, wherein substantially none of said fill layer selectively deposits on said remaining inhibitor layer.

28. The method of claim 27, wherein said exposed portion of said seed layer is substantially planar.

29. The method of claim 27, wherein removing said portion of said inhibitor layer comprises laser ablation.

30. The method of claim 27, wherein said fill layer and/or said seed layer comprises copper metal and/or a copper alloy.

31. The method of claim 27, wherein said barrier layer and/or said inhibitor layer comprises Ta (tantalum).

32. A method of forming a semiconductor structure, comprising:

forming a barrier layer over a workpiece;

forming a seed layer over said barrier layer;

forming an inhibitor layer over said seed layer;

removing a portion of said inhibitor layer to expose a portion of said seed layer, said exposed seed layer being substantially planar; and selectively depositing a fill layer on said exposed seed layer, wherein substantially none of said fill layer selectively deposits on said remaining inhibitor layer.

33. The method of claim 32, wherein said removing said portion of said inhibitor layer comprises laser ablation.

34. The method of claim 32, wherein said fill layer and/or said seed layer comprises copper metal and/or a copper alloy.

35. The method of claim 32, wherein said barrier layer and/or said inhibitor layer comprises Ta (tantalum).

* * * * *